US011244901B2

(12) United States Patent
Huang

(10) Patent No.: US 11,244,901 B2
(45) Date of Patent: Feb. 8, 2022

(54) SEMICONDUCTOR DEVICE WITH GRADED POROUS DIELECTRIC STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 2 days.

(21) Appl. No.: 16/789,091

(22) Filed: Feb. 12, 2020

(65) Prior Publication Data
US 2021/0249355 A1 Aug. 12, 2021

(51) Int. Cl.
*H01L 29/06* (2006.01)
*H01L 27/088* (2006.01)
*H01L 23/532* (2006.01)
*H01L 29/66* (2006.01)
*H01L 21/8234* (2006.01)
*H01L 29/78* (2006.01)

(52) U.S. Cl.
CPC .. *H01L 23/5329* (2013.01); *H01L 21/823431* (2013.01); *H01L 27/0886* (2013.01); *H01L 29/66795* (2013.01); *H01L 29/785* (2013.01)

(58) Field of Classification Search
CPC ............... H01L 23/5329; H01L 29/785; H01L 21/823431; H01L 27/0886; H01L 29/66795
See application file for complete search history.

(56) References Cited

U.S. PATENT DOCUMENTS

2013/0095255 A1* 4/2013 Vrtis ....................... C23C 16/30
427/558
2018/0197970 A1* 7/2018 Pan .................... H01L 29/41791

* cited by examiner

*Primary Examiner* — Cuong B Nguyen
(74) *Attorney, Agent, or Firm* — Muncy, Geissler, Olds & Lowe, P.C.

(57) ABSTRACT

The present application discloses a semiconductor device with a graded porous dielectric structure. The semiconductor device includes a substrate; two conductive features positioned apart from each other over the substrate; a graded porous dielectric structure positioned between the two conductive features; and a dielectric layer positioned between one of the two conductive features and the graded porous dielectric structure; wherein the graded porous dielectric structure comprises a first portion having a first porosity and a second portion having a second porosity, and the second porosity is higher than the first porosity.

5 Claims, 35 Drawing Sheets

SEMICONDUCTOR DEVICE WITH GRADED POROUS DIELECTRIC STRUCTURE

TECHNICAL FIELD

The present disclosure relates to a semiconductor device, and more particularly, to a semiconductor device with a graded porous dielectric structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; two conductive features positioned apart from each other over the substrate; a graded porous dielectric structure positioned between the two conductive features; and a dielectric layer positioned between one of the two conductive features and the graded porous dielectric structure; wherein the graded porous dielectric structure comprises a first portion having a first porosity and a second portion having a second porosity, and the second porosity is higher than the first porosity.

In some embodiments, the graded porous dielectric structure comprises an energy-removable material consisting of a base material and a decomposable porogen material.

In some embodiments, the base material comprises silicon oxide, and the decomposable porogen material comprises compounds comprising unsaturated bonds.

In some embodiments, the two conductive features are contacts.

In some embodiments, the two conductive features are two source/drain regions positioned adjacent to two sides of a gate structure.

In some embodiments, the two conductive features include a gate structure and a source/drain region, and the graded porous dielectric structure is positioned between the source/drain region and the gate structure.

In some embodiments, the semiconductor device further comprises a porous capping layer positioned on the two conductive features, wherein a porosity of the porous capping layer is between about 25% and about 100%.

In some embodiments, the semiconductor device further comprises two source/drain regions, wherein the porous capping layer is positioned between the two source/drain regions.

In some embodiments, the semiconductor device further comprises two bottom etch stop layers positioned under the two source/drain regions.

In some embodiments, the semiconductor device further comprises a gate structure and a fin positioned between the gate structure and the substrate.

In some embodiments, the fin comprises a protruding portion and two recessed portions positioned adjacent to two sides of the protruding portion, wherein a top surface of the protruding portion is at a vertical level higher than a vertical level of top surfaces of the recessed portions, the gate structure is positioned on the protruding portion, and the two source/drain regions are positioned on the recessed portions.

In some embodiments, the semiconductor device further comprises a first stop layer positioned between the fin and the substrate.

In some embodiments, the first stop layer has a thickness between about 1 nm and about 50 nm.

In some embodiments, the semiconductor device further comprises a plurality of covering layers positioned on the two source/drain regions, wherein the plurality of covering layers are formed of metal silicide.

Another aspect of the present disclosure provides a semiconductor device semiconductor device, comprising: a substrate; a gate structure positioned above the substrate; two source/drain regions positioned adjacent to two sides of the gate structure; a graded porous dielectric structure positioned between the gate structure and the source/drain regions, wherein the graded porous dielectric structure has a graded porosity along a direction from the gate structure to the source/drain regions; and an insulating layer disposed over the two porous spacers and the porous capping layer.

In some embodiments, the semiconductor device further comprises two bottom etch stop layers positioned under the two porous spacers.

In some embodiments, the graded porous dielectric structure comprises an energy-removable material consisting of a base material and a decomposable porogen material, and the base material comprises silicon oxide, and the decomposable porogen material comprises compounds comprising unsaturated bonds.

In some embodiments, the semiconductor device further comprises a fin positioned between the gate structure and the substrate.

In some embodiments, the fin comprises a protruding portion and two recessed portions positioned adjacent to two sides of the protruding portion, wherein a top surface of the protruding portion is at a vertical level higher than a vertical level of top surfaces of the recessed portions, the gate structure is positioned on the protruding portion, and the two source/drain regions are positioned on the recessed portions.

In some embodiments, the semiconductor device further comprises a first stop layer positioned between the fin and the substrate.

Due to the design of the semiconductor device of the present disclosure, a coupling capacitance between the gate structure and the source/drain regions may be reduced; so that an RC delay of the semiconductor device may be reduced. In addition, with the presence of the covering layer, an operating current consumption of the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
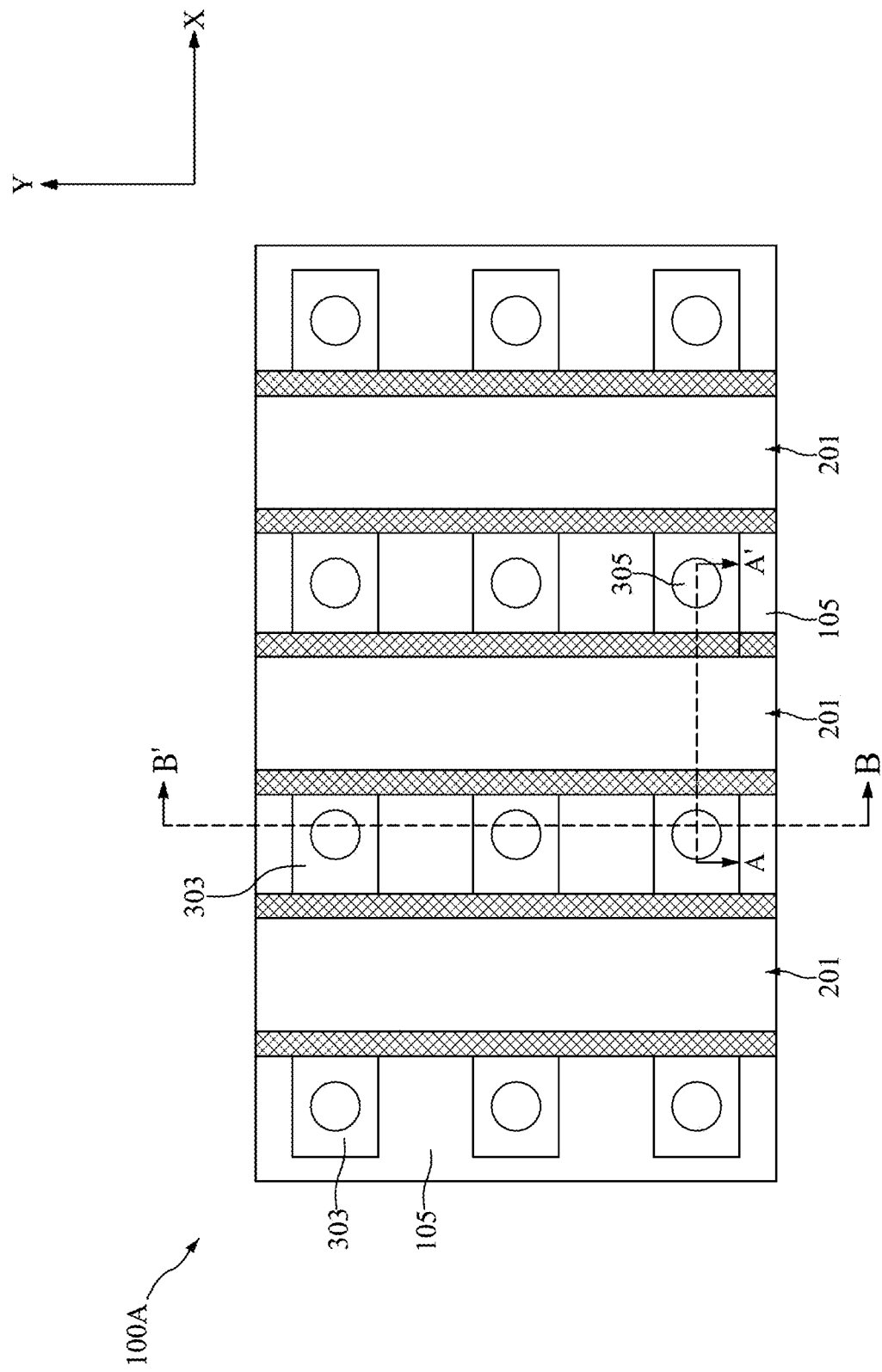
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
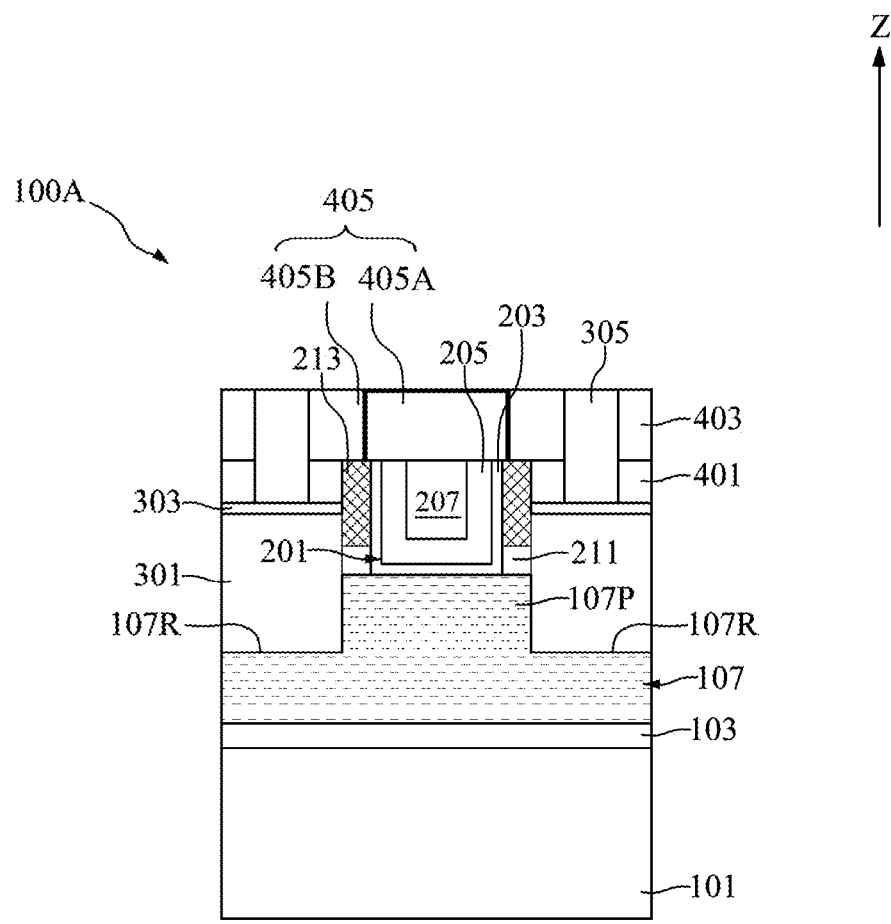
FIG. 2 is a schematic cross-sectional view diagram taken along a line A-A' in FIG. 1.
Figure 3:
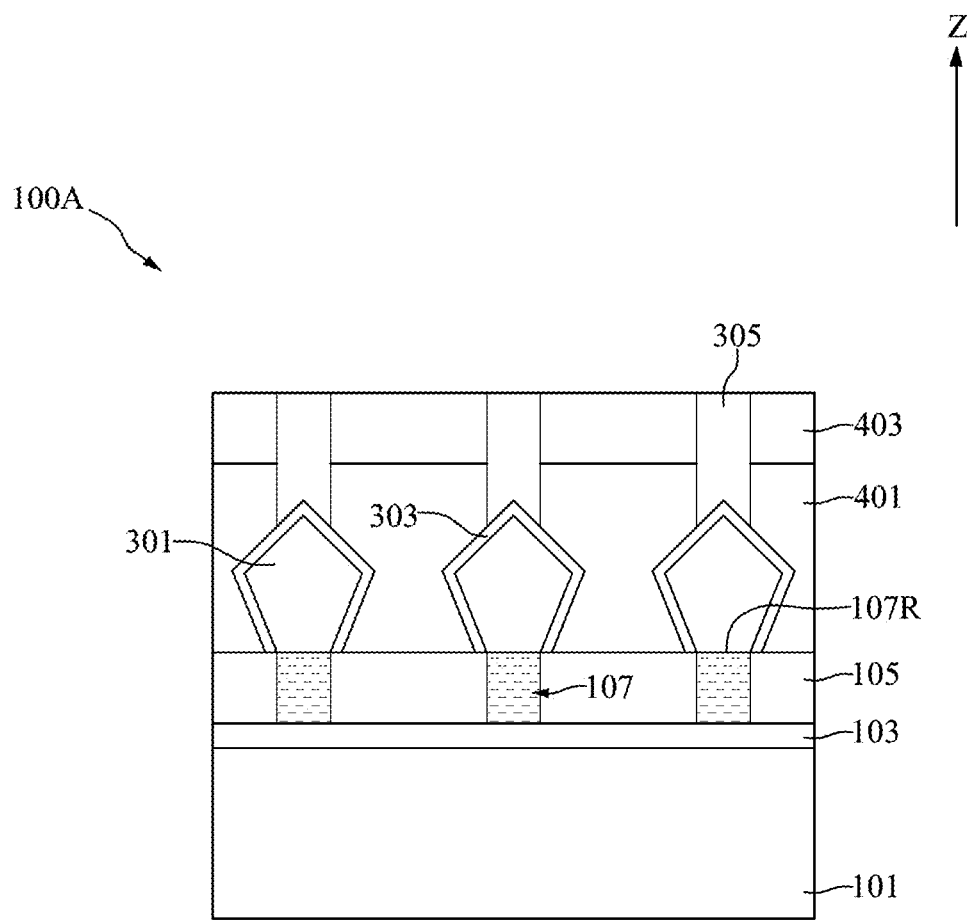
FIG. 3 is a schematic cross-sectional view diagram taken along a line B-B' in FIG. 1.

FIG. 1 illustrates, in a schematic top-view diagram, a semiconductor device 100A in accordance with one embodiment of the present disclosure. FIG. 2 is a schematic cross-sectional view diagram taken along a line A-A' in FIG. 1. FIG. 3 is a schematic cross-sectional view diagram taken along a line B-B' in FIG. 1. Some elements of the semiconductor device 100A are not shown in FIG. 1 for clarity.

With reference to FIGS. 1 to 3, in the embodiment depicted, the semiconductor device 100A may include a substrate 101, a first stop layer 103, an isolation layer 105, a plurality of fins 107, a plurality of gate structures 201, a plurality of bottom etch stop layers 211, a plurality of porous spacers 213, a plurality of source/drain regions 301, a plurality of covering layers 303, a plurality of contacts 305, a first insulating layer 401 and a second insulating layer 403.

With reference to FIGS. 1 to 3, in the embodiment depicted, the substrate 101 may be formed of, for example, silicon, silicon carbide, germanium silicon germanium, gallium arsenic, indium arsenide, indium, or other semiconductor materials including group III, group IV, or group V elements. The substrate 101 may include a silicon-on-insulator structure. For example, the substrate 101 may include a buried oxide layer formed by using a process such as separation by implanted oxygen.

With reference to FIGS. 1 to 3, in the embodiment depicted, the first stop layer 103 may be disposed on the substrate 101. The first stop layer 103 may have a thickness between about 1 nm and about 50 nm. The first stop layer 103 may be formed of, for example, silicon germanium, silicon oxide, silicon germanium oxide, silicon phosphide, or silicophosphates.

With reference to FIGS. 1 to 3, in the embodiment depicted, the plurality of fins 107 may be disposed on the first stop layer 103. The plurality of fins 107 may provide active regions for the semiconductor device 100A in which channels are formed according to voltages applied to the plurality of gate structures 201. Each of the plurality of fins 107 may extend along a first direction X. The plurality of fins 107 may be spaced apart from each other along a second direction Y crossing the first direction X. Each of the plurality of fins 107 may protrude from the first stop layer 103 in the direction Z perpendicular to the first direction X and the second direction Y. Each of the plurality of fins 107 may include a protruding portion 107P and two recessed portions 107R. The protruding portion 107P may be disposed on the first stop layer 103 and extend along the first direction X. The two recessed portions 107R may be respectively correspondingly disposed adjacent to two sides of the protruding portion 107P. A top surface of the protruding portion 107P may be at a vertical level higher than a vertical level of top surfaces of the recessed portions 107R. The plurality of fins 107 may be formed of, for example, silicon, silicon carbide, germanium silicon germanium, gallium arsenic, indium arsenide, indium, or other semiconductor materials including group III, group IV, or group V elements.

It should be noted that the plurality of fins 107 include three fins, but the number of fins is not limited thereto. For example, the number of the fins 107 may be less than three or more than three.

Alternatively, in another embodiment, the semiconductor device may include a plurality of nanowires instead of the plurality of fins 107 to provide active regions.

With reference to FIGS. 1 to 3, in the embodiment depicted, the isolation layer 105 may be disposed on the first stop layer 103 and between the plurality of fins 107. Top surfaces of the isolation layer 105 may be at a same vertical level as the recessed portions 107R. The isolation layer 105 may isolate the plurality of fins 107 from each other to prevent electrical leakage between adjacent semiconductor components. The isolation layer 105 may be formed of, for example, silicon nitride, silicon oxide, silicon oxynitride, or silicon nitride oxide.

It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen.

With reference to FIGS. 1 to 3, in the embodiment depicted, the plurality of gate structures 201 may be disposed on the plurality of fins 107 and the isolation layer 105. Each of the plurality of gate structures 201 may extend along the second direction Y. In other words, the plurality of gate structures 201 may intersect the plurality of fins 107 from a top-view perspective. The plurality of gate structures 201 may be spaced apart from each other along the first direction X. Each of the plurality of gate structures 201 may include a gate insulating layer 203, a gate conductive layer 205 and a gate filler layer 207.

With reference to FIGS. 1 to 3, in the embodiment depicted, the gate insulating layer 203 may have a U-shaped cross-sectional profile. The gate insulating layer 203 may be disposed on a top surface of the protruding portion 107P. The gate insulating layer 203 may have a thickness between about 0.5 nm and about 5.0 nm. In some embodiments, the thickness of the gate insulating layer 203 may be between about 0.5 nm and about 2.5 nm. The gate insulating layer 203 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the gate insulating layer 203 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In other embodiments, the gate insulating layer 203 may be a multilayer structure that includes, for example, one layer of silicon oxide and another layer of high-k dielectric material.

With reference to FIGS. 1 to 3, in the embodiment depicted, the gate conductive layer 205 may have a U-shaped cross-sectional profile. The gate conductive layer 205 may be disposed on the gate insulating layer 203. The gate conductive layer 205 may have a thickness between about 10 angstroms and about 200 angstroms. Top surfaces of the gate conductive layer 205 may be at a same vertical level as the top surfaces of the gate insulating layer 203. The gate conductive layer 205 may be formed of, for example, a conductive material such as polycrystalline silicon, polycrystalline silicon germanium, metal nitride, metal silicide, metal oxide, metal, or a combination thereof. Metal nitride may be, for example, tungsten nitride, molybdenum nitride, titanium nitride or tantalum nitride. Metal silicide may be, for example, tungsten silicide, titanium silicide, cobalt silicide, nickel silicide, platinum silicide or erbium silicide. Metal oxide may be, for example, ruthenium oxide or indium tin oxide. Metal may be, for example, tungsten, titanium, aluminum, copper, molybdenum, nickel or platinum. The gate conductive layer 205 may serve to adjust a work function of the gate structure 201.

With reference to FIGS. 1 to 3, in the embodiment depicted, the gate filler layer 207 may be disposed in the gate conductive layer 205. A top surface of the gate filler layer 207 may be at a same vertical level as the top surfaces of the gate conductive layer 205. The gate filler layer 207 may be formed of, for example, tungsten or aluminum. The gate filler layer 207 may serve to fill up a space formed by the gate conductive layer 205.

With reference to FIGS. 1 to 3, for each of the plurality of the gate structures 201, two bottom etch stop layers 211 may be disposed on the top surface of the protruding portion 107P. The two bottom etch stop layers 211 may be respectively correspondingly disposed adjacent to lower portions of two sides of the gate structure 201. Specifically, the two bottom etch stop layers 211 may be disposed adjacent to lower portions of sidewalls of the gate insulating layer 203. The sidewalls of the gate insulating layer 203 may be opposite to the gate conductive layer 205. Top surfaces of the two bottom etch stop layers 211 may be at a vertical level lower than a vertical level of the top surfaces of the gate insulating layer 203. It should be noted that the two bottom etch stop layers 211 may extend along the second direction Y (for clarity, such embodiment is not shown in the top-view diagram in FIG. 1). The two bottom etch stop layers 211 may be formed of, for example, carbon-doped oxide, carbon incorporated silicon oxide, ornithine decarboxylase, or nitrogen-doped silicon carbide.

With reference to FIGS. 1 to 3, in the embodiment depicted, the plurality of porous spacers 213 may be disposed adjacent to the sides of the plurality of gate structures 201. The plurality of porous spacers 213 may extend along the second direction Y from a top-view perspective. For each of the plurality of gate structures 201, two porous spacers 213 may be disposed adjacent to the two sides of the gate structure 201. The two porous spacers 213 may be respectively correspondingly disposed on the two bottom etch stop layers 211. Top surfaces of the two porous spacers 213 may be at a same vertical level as the top surfaces of the gate insulating layer 203. The two porous spacers 213 may be formed from an energy-removable material, as will be illustrated later. For each of the two porous spacers 213, the porous spacer 213 may include a skeleton and a plurality of empty spaces disposed among the skeleton. The plurality of empty spaces may connect to each other and may be filled with air. The skeleton may include, for example, silicon oxide or methylsilsesquioxane. The two porous spacers 213 may have a porosity between 25% and 100%. It should be noted that, when the porosity is 100%, it means the porous spacer 213 includes only an empty space and the porous spacer may be regarded as an air gap. In some embodiments, the porosity of the two porous spacers 213 may be between 45% and 95%. The plurality of the porous spacers 213 may serve to electrically isolate the plurality of gate structures 201 from other conductive features such as the plurality of source/drain regions 301. In addition, the plurality of empty spaces of the porous spacer 213 may be filled with air. As a result, a dielectric constant of the porous spacer 213 may be significantly lower than a spacer formed of, for example, silicon oxide. Therefore, the porous spacer 213 may significantly reduce the parasitic capacitance between the gate structure 201 and adjacent conductive features, such as the plurality of source/drain regions 301. That is, the porous spacer 213 may significantly alleviate an interference effect between electrical signals induced or applied to the gate structure.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source.

From a top-view perspective as in FIG. 1, the plurality of source/drain regions 301 may be respectively correspondingly disposed adjacent to the sides of the plurality of gate structures 201 with the plurality of porous spacers 213 interposed therebetween. From a cross-sectional perspective as in FIG. 2, the source/drain regions 301 may be disposed on the top surfaces of the recessed portions 107R. Top surfaces of the source/drain regions 301 may be at a vertical level lower than the vertical level of the top surfaces of the two porous spacers 213. The vertical level of the top surfaces of the source/drain regions 301 may be higher than the vertical level of the top surfaces of the two bottom etch stop layers 211. From another cross-sectional perspective as in FIG. 3, the source/drain regions 301 have a pentagonal shape. Bottoms of the source/drain regions 301 may have a same width as the top surfaces of the recessed portions 107R. The plurality of source/drain regions 301 may be formed of, for example, silicon germanium or silicon carbide. A lattice constant of silicon germanium is greater than that of silicon. A lattice constant of silicon carbide is smaller than that of silicon. The plurality of source/drain regions 301 formed of silicon germanium or silicon carbide may apply a compressive or tensile stress to the plurality of fins 107 and improve the mobility of carriers in the channels.

With reference to FIGS. 1 to 3, in the embodiment depicted, the plurality of covering layers 303 may be respectively correspondingly disposed on the plurality of source/drain regions 301. Top surfaces of the plurality of covering layers 303 may be at a vertical level between the vertical level of the top surfaces of the two porous spacers 213 and the vertical level of the top surfaces of the two bottom etch stop layers 211. From a cross-sectional perspective as in FIG. 3, the covering layer 303 may be disposed on outer surfaces of the source/drain region 301 except for the bottom of the source/drain region 301. The plurality of covering layers 303 may be formed of, for example, titanium silicide, nickel silicide, nickel platinum silicide, tantalum silicide, or cobalt silicide. The plurality of covering layers 303 may serve to reduce contact resistance between the plurality of source/drain regions 301 and the plurality of contacts 305, as will be illustrated later. In addition, the plurality of covering layers 303 may have lower resistance compared to the plurality of source/drain regions 301. Therefore, in an operation of the semiconductor device 100A, most of a current may flow through the covering layer 303 to reach the fin 107, and only a small portion of the current may flow through the source/drain region 301 to reach the fin 107. As a result, the operating current consumption of the semiconductor device 100A may be low.

With reference to FIGS. 1 to 3, in the embodiment depicted, the first insulating layer 401 may be disposed on the plurality of covering layers 303 and the isolation layer 105. The first insulating layer 401 may enclose the plurality of covering layers 303 and upper portions of sidewalls of the plurality of porous spacers 213. The first insulating layer 401 may be formed of, for example, silicon oxynitride, silicon nitride oxide, silicon carbon, silicon oxide, or silicon nitride. Alternatively, in another embodiment, the first insulating layer 401 may be formed of, for example, a low-k dielectric material having atoms of Si, C, O, B, P, N, or H. For example, the dielectric constant of the low-k dielectric material may be between about 2.4 and 3.5 depending upon mole fractions of the aforementioned atoms. The first insulating layer 401 may have a mechanical strength sufficient to support the plurality of porous spacers 213 or to prevent the plurality of porous spacers 213 from collapsing.

With reference to FIGS. 1 to 3, in the embodiment depicted, the second insulating layer 403 may be disposed on the first insulating layer 401 and the plurality of gate structures 201. The second insulating layer 403 may be formed of a same material as the first insulating layer 401, but is not limited thereto.

With reference to FIGS. 1 to 3, in the embodiment depicted, the plurality of contacts 305 may be disposed penetrating the second insulating layer 403 and the first insulating layer 401, and respectively correspondingly disposed on the plurality of covering layers 303. The plurality of contacts 305 may be formed of, for example, tungsten, copper, cobalt, ruthenium, or molybdenum.

In some embodiments, the semiconductor device 100A comprises a porous dielectric structure 405 between two conductive features such as the two contacts 305 in FIG. 3. In some embodiments, the graded porous dielectric structure 405 comprises an energy-removable material consisting of a base material and a decomposable porogen material, similar to that used in the porous spacers 213.

In some embodiments, the graded porous dielectric structure 405 comprises a first portion 405A having a first porosity and a second portion 405B having a second porosity, and the second porosity is higher than the first porosity. In some embodiments, the graded porous dielectric structure 405 has a graded porosity along a direction from the gate structure 201 to the source/drain region 301. In some embodiments, the porosity of the graded porous dielectric structure is higher than that of the gate insulating layer 203. In some embodiments, the porosity of the graded porous dielectric structure is higher than that of the second insulating layer 403. In some embodiments, the porosity of the graded porous dielectric structure is higher than that of first insulating layer 401. In some embodiments, the porous spacers 213 may be implemented to have the graded porosity similar to the graded porous dielectric structure 405.

Figure 9:
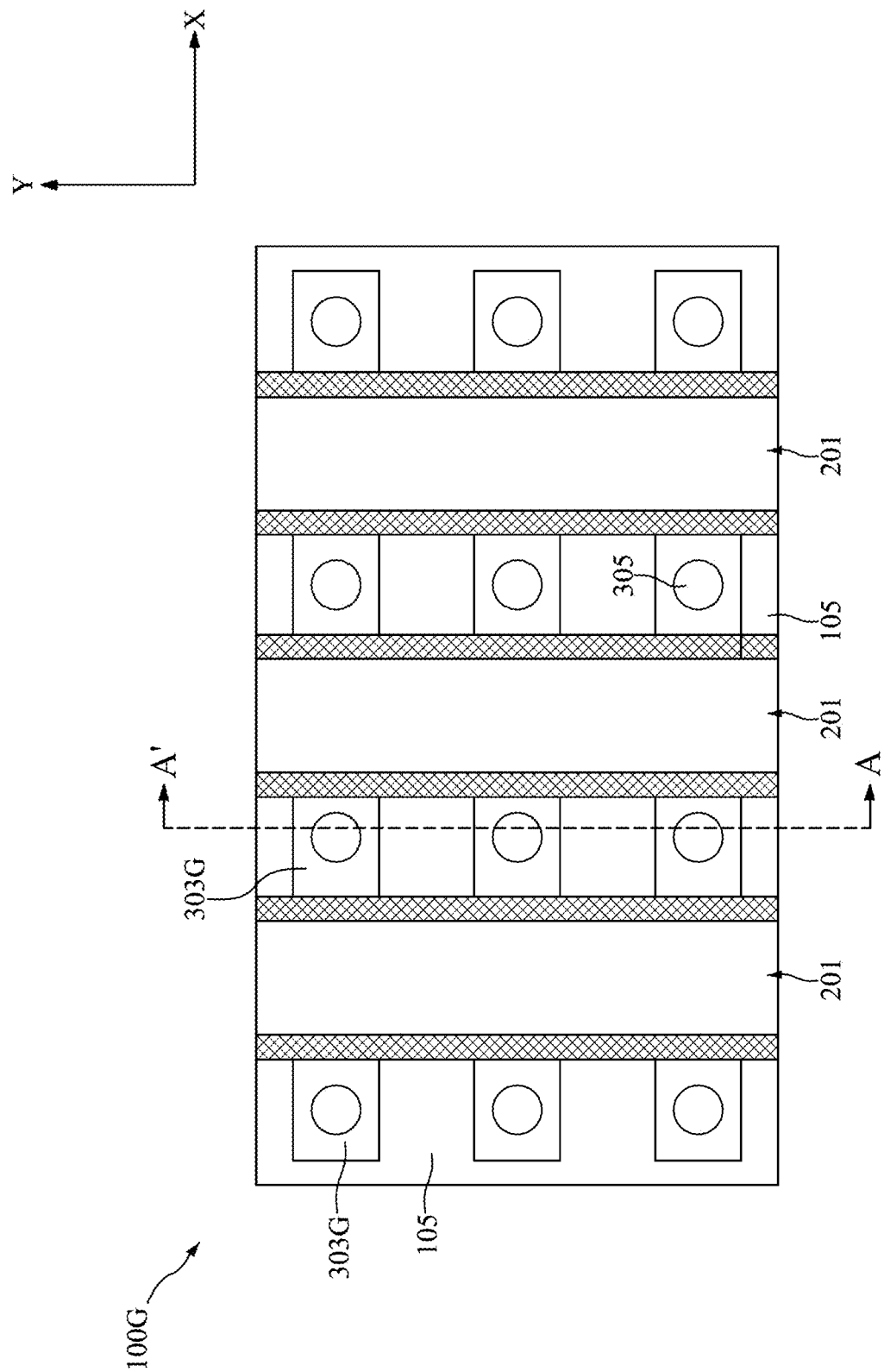
FIG. 9 illustrates, in a schematic top-view diagram, a semiconductor device in accordance with one embodiment of the present disclosure.
Figure 10:
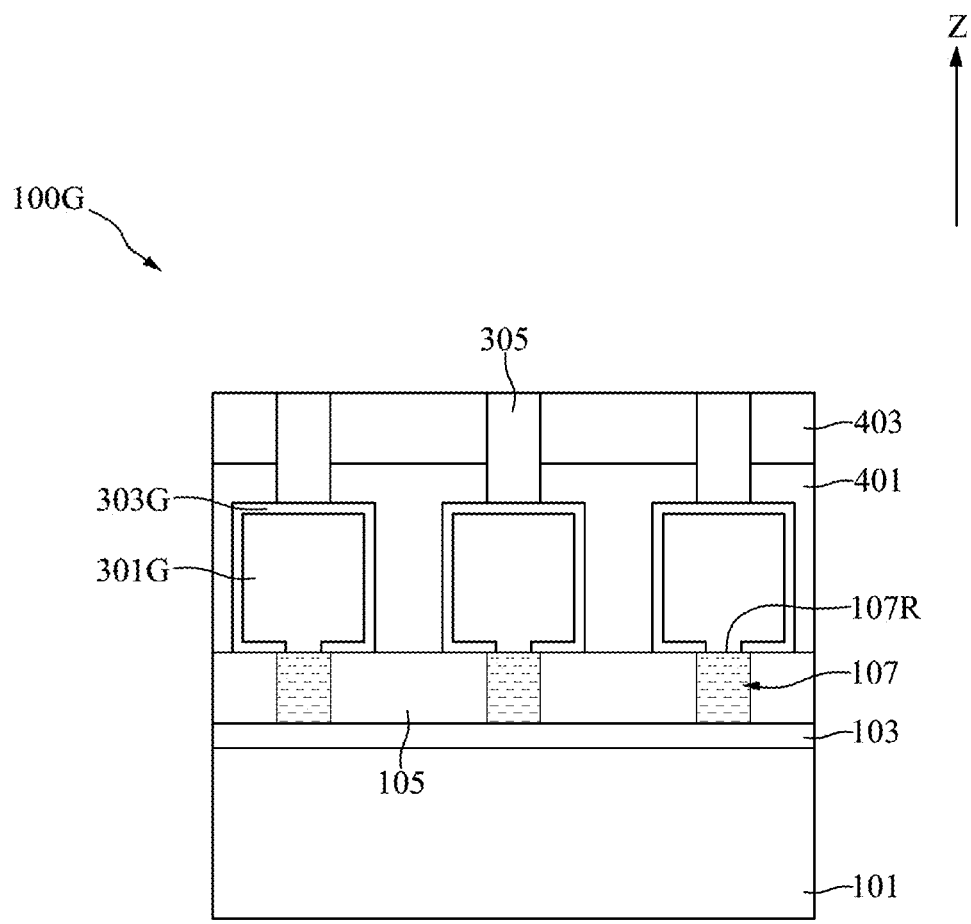
FIG. 10 is a schematic cross-sectional view diagram taken along a line A-A' in FIG. 9.

FIGS. 4 to 8 illustrate, in schematic cross-sectional view diagrams similar to FIG. 2, semiconductor devices 100B, 100C, 100D, 100E and 100F in accordance with embodiments of the present disclosure. FIG. 9 illustrates, in a schematic top-view diagram, a semiconductor device 100G in accordance with one embodiment of the present disclosure. FIG. 10 is a schematic cross-sectional view diagram taken along a line A-A' in FIG. 9.

Figure 4:
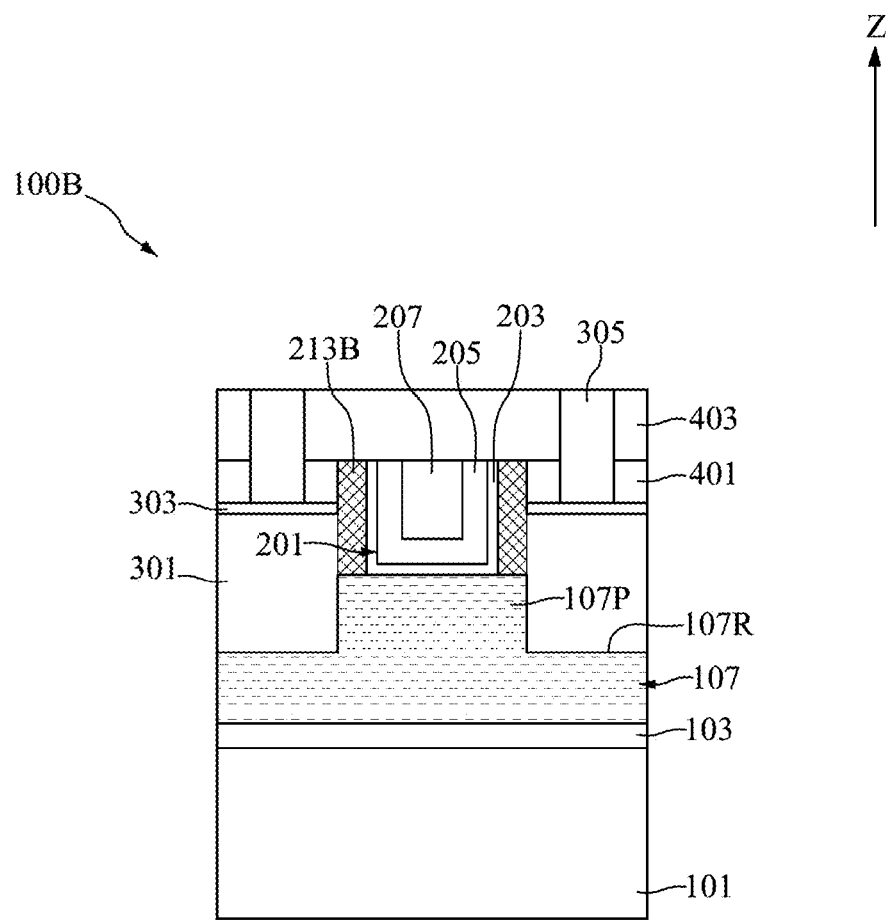
FIGS. 4 to 8 illustrate, in schematic cross-sectional view diagrams similar to that in FIG. 2, semiconductor devices in accordance with embodiments of the present disclosure.
Figure 5:
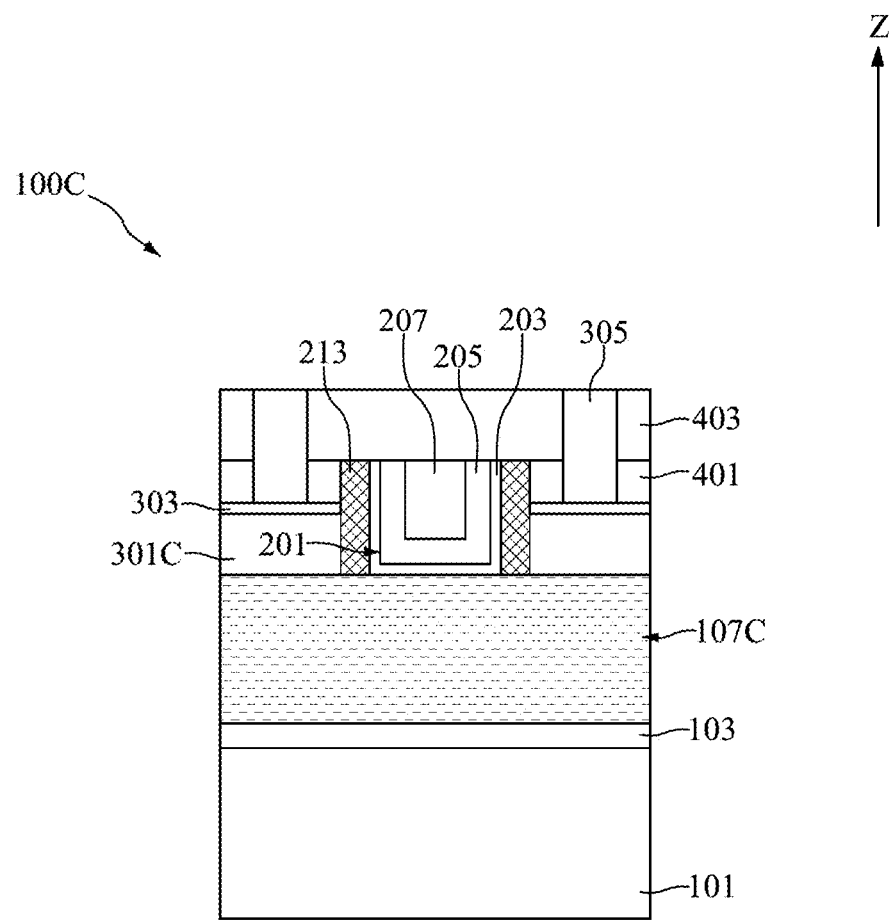

With reference to FIG. 4, in the semiconductor device 100B, the two porous spacers 213B may be disposed on a top surface of the protruding portion 107P. With reference to FIG. 5, in the semiconductor device 100C, each of the plurality of fins 107C may have no recessed portions. Bottoms of the source/drain regions 301C may be at a same vertical level as a vertical level of a bottom of the gate insulating layer 203.

Figure 6:
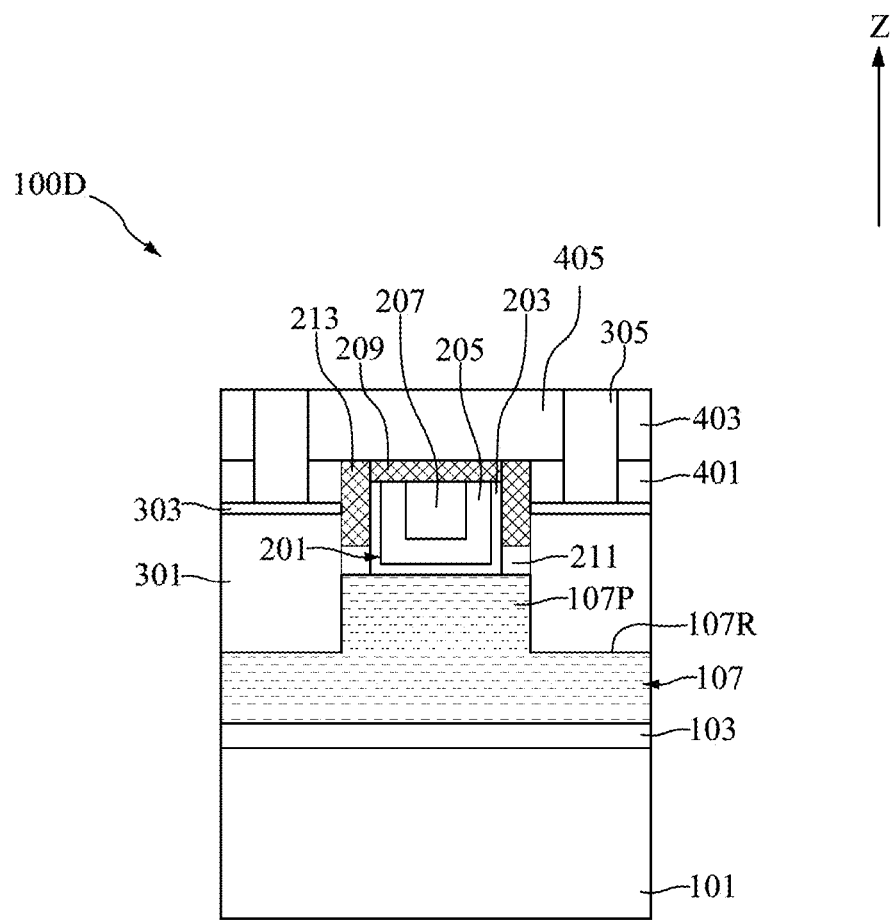

With reference to FIG. 6, the semiconductor device 100D may include a porous capping layer 209. The porous capping layer 209 may be disposed on the top surfaces of the gate insulating layer 203, the top surfaces of the gate conductive layer 205, and the top surface of the gate filler layer 207. The porous capping layer 209 may be disposed between the two porous spacers 213 and disposed below the second insulating layer 403. The porous capping layer 209 may have a porosity between 25% and 100%. In some embodiments, the porosity of the porous capping layer 209 may be between 45% and 95%. The porous capping layer 209 may have the same structure feature as the porous spacers 213 and may significantly reduce the parasitic capacitance between the gate structure 201 and conductive features disposed above the gate structure 201. In some embodiments, the porous capping layer 209 may be implemented to have the graded porosity similar to the graded porous dielectric structure 405.

Figure 7:
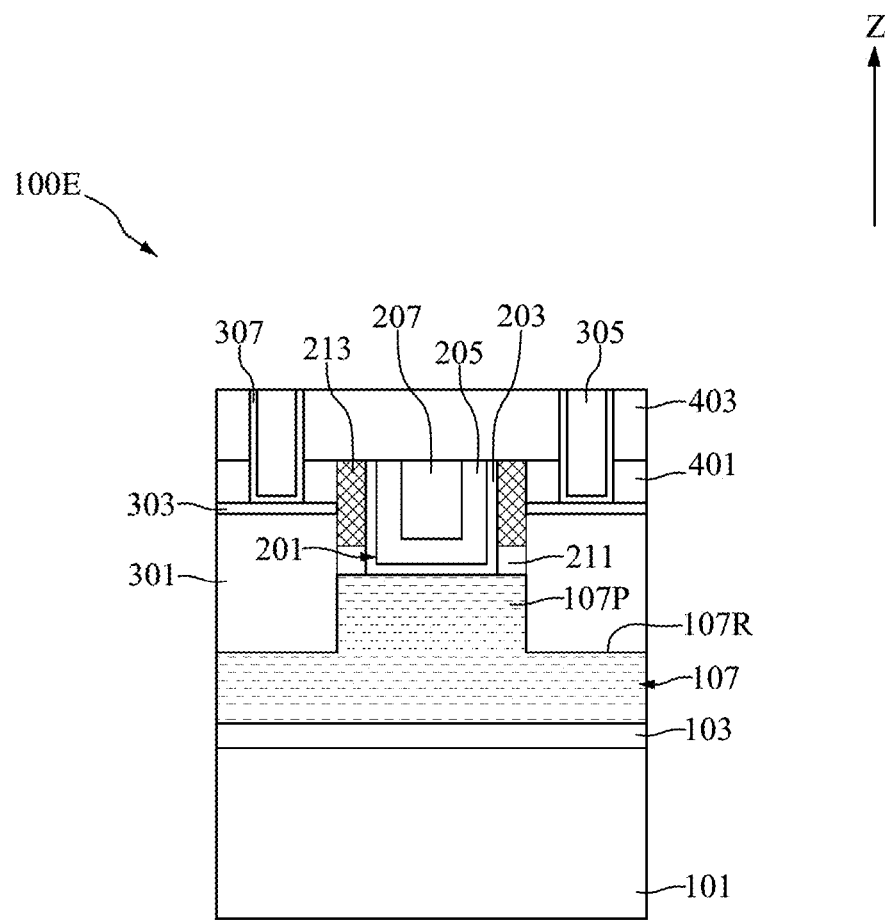

With reference to FIG. 7, the semiconductor device 100E may include a plurality of contact liners 307. The plurality of contact liners 307 may be respectively correspondingly disposed between the plurality of contacts 305 and the plurality of covering layers 303. The contact liner 307 may serve as a protective layer for its underlying structure (e.g., the covering layer 303 and the source/drain region 301) during formation of the contact 305. The contact liner 307 may also serve as an adhesive layer between the contact 305 and the covering layer 303 or between the contact 305 and the source/drain region 301.

Figure 8:
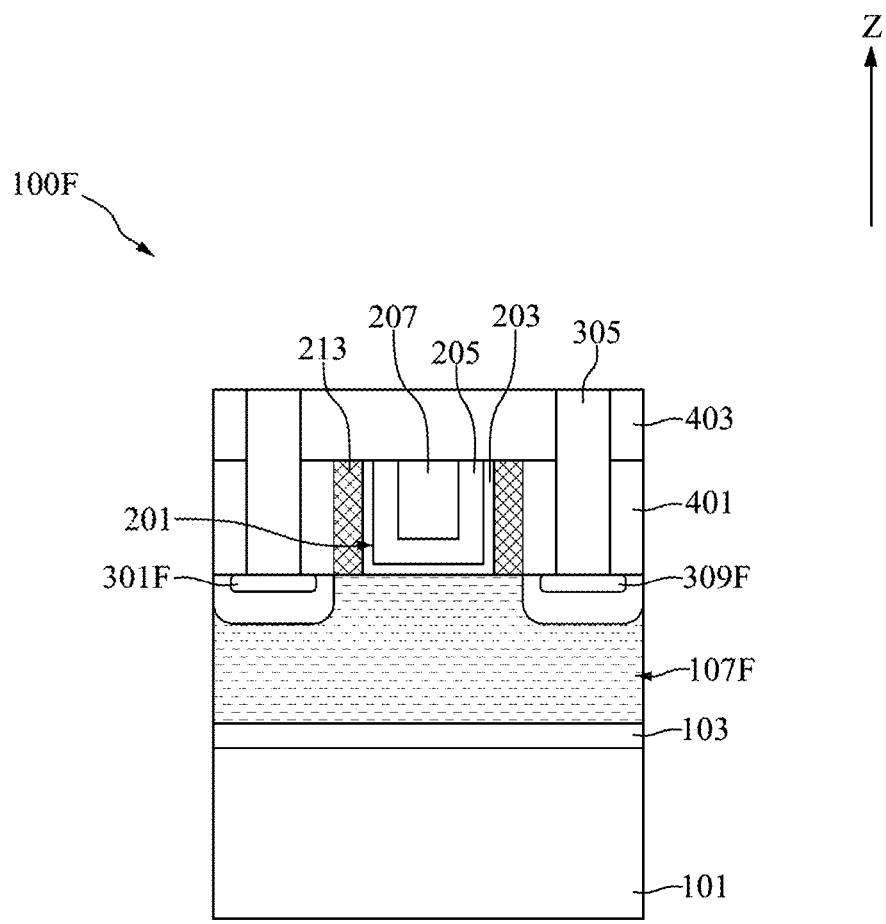

With reference to FIG. 8, in the semiconductor device 100F, each of the plurality of fins 107F may have no recessed portions. The source/drain regions 301F may be disposed in the fin 107F and respectively correspondingly adjacent to the two porous spacers 213. The source/drain regions 301F may be include silicon doped with dopants or silicon germanium doped with dopants. The dopants may be phosphorus, arsenic, antimony, boron, or indium.

With reference to FIGS. 9 and 10, in the semiconductor device 100G, the source/drain region 301G may have a square shape. The covering layer 303G may be disposed on portions of a bottom of the source/drain region 301, sidewalls of the source/drain region 301, and a top surface of the source/drain region 301. Alternatively, in another embodiment, the source/drain region 301 may have a rectangular shape, a diamond shape, a circular shape, or a shape having more than five sides.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 11:
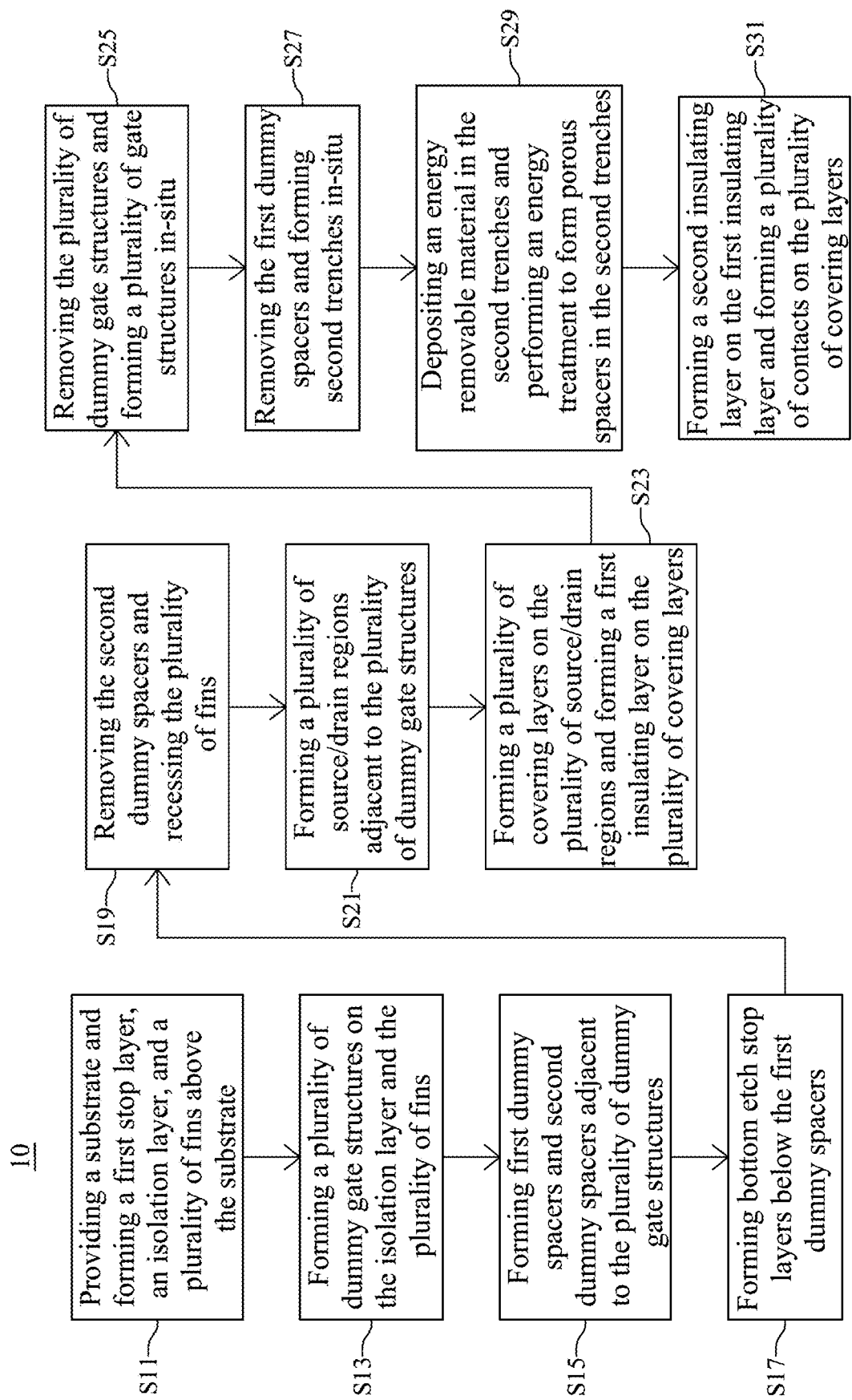
FIG. 11 illustrates, in a flowchart diagram form, a method for fabricating a semiconductor device in accordance with one embodiment of the present disclosure.
Figure 12:
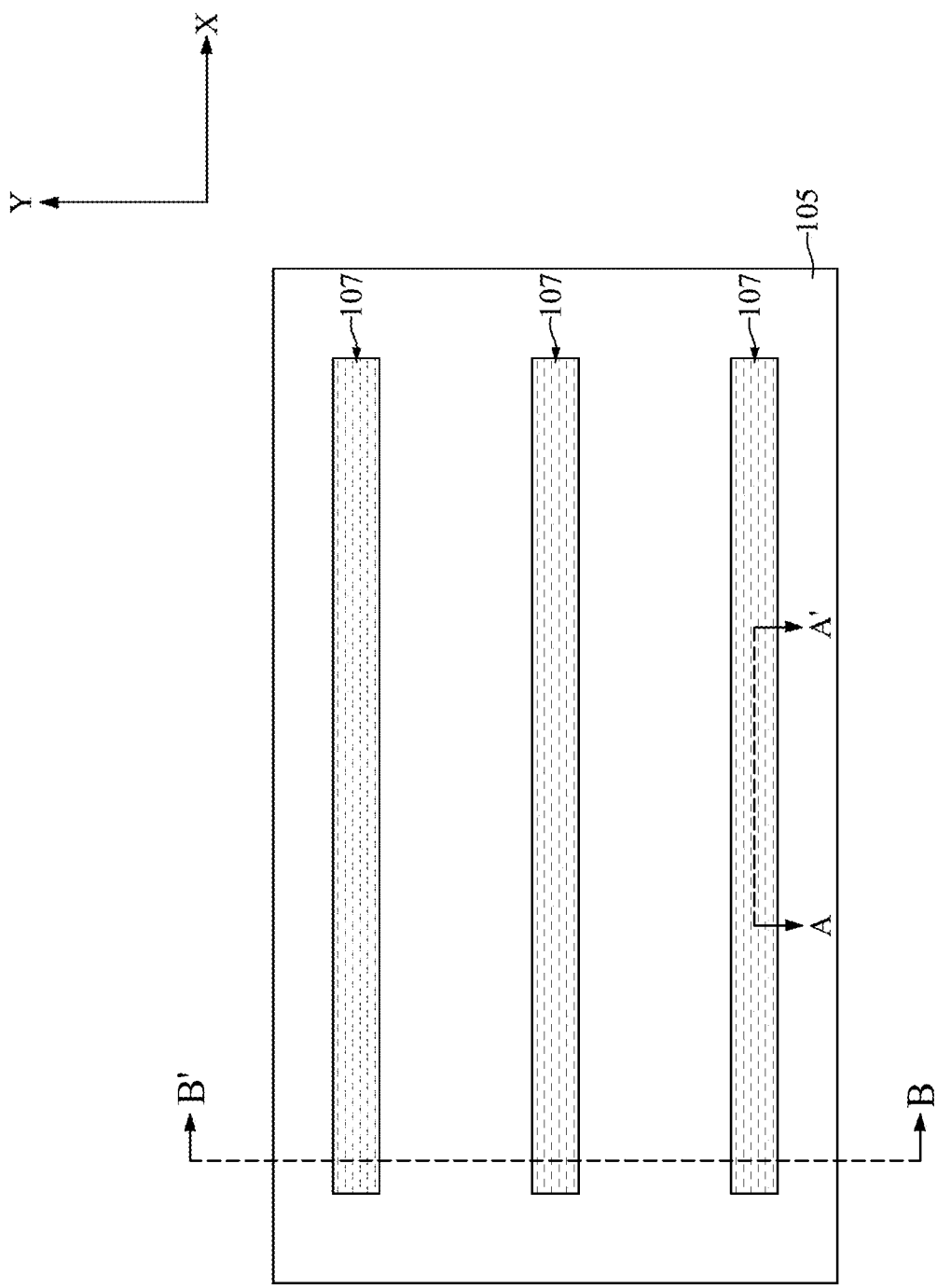
FIG. 12 illustrates, in a schematic top-view diagram, an intermediate semiconductor device in accordance with one embodiment of the present disclosure.
Figure 13:
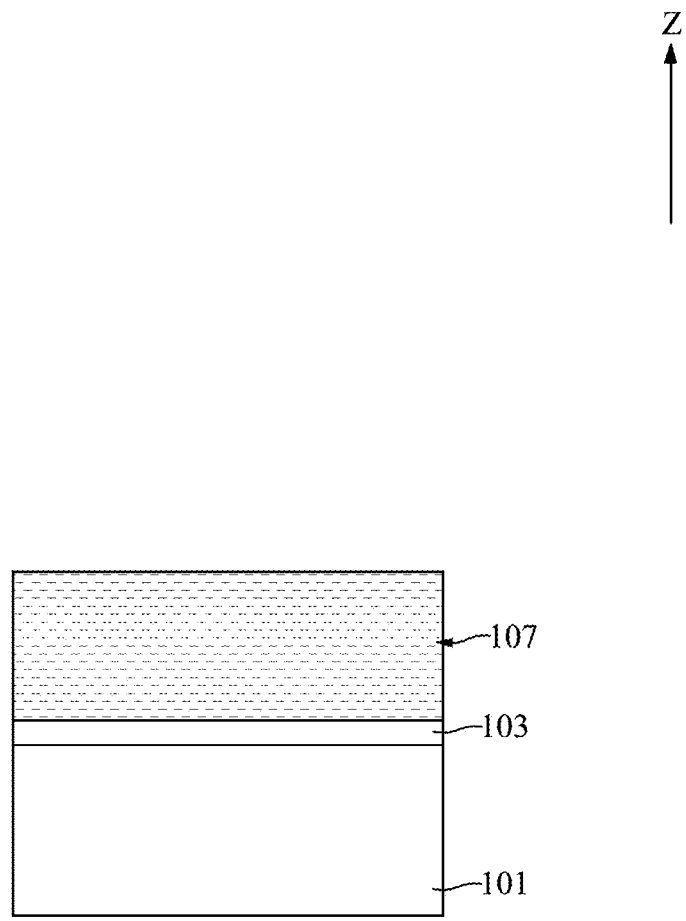
FIG. 13 is a schematic cross-sectional view diagram taken along the line A-A' in FIG. 12 illustrating part of a flow for fabricating the semiconductor device in accordance with one embodiment of the present disclosure.
Figure 14:
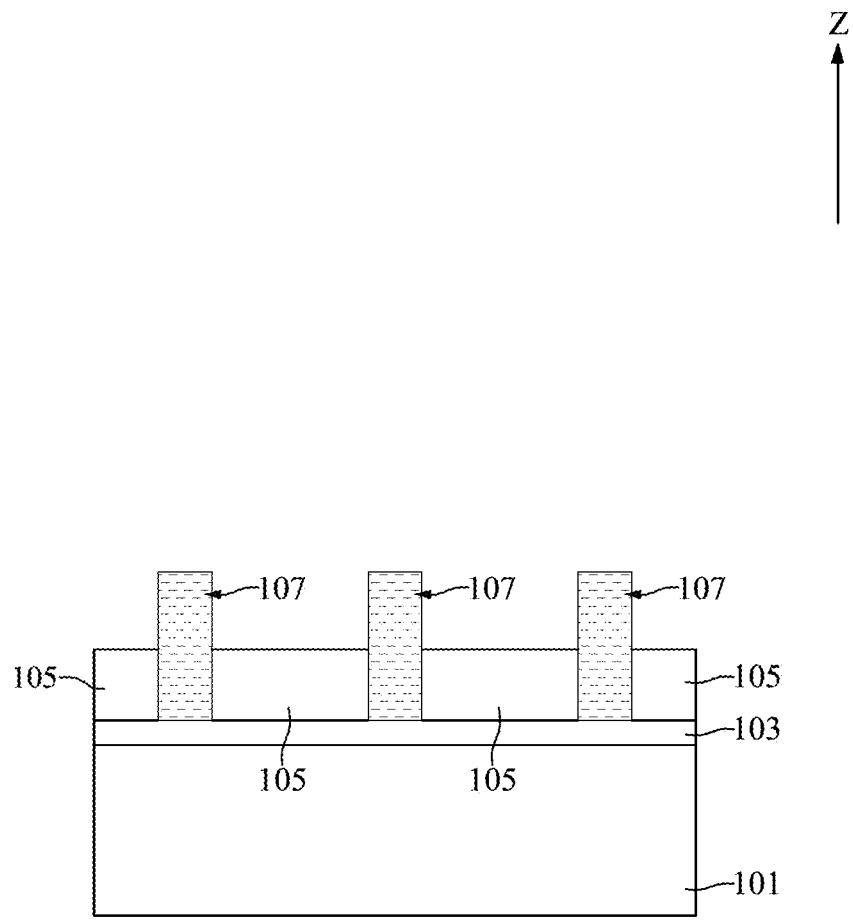
FIG. 14 is a schematic cross-sectional view diagram taken along the line B-B' in FIG. 12 illustrating part of a flow for fabricating the semiconductor device in accordance with one embodiment of the present disclosure.

FIG. 11 illustrates, in a flowchart diagram form, a method 10 for fabricating a semiconductor device 100A in accordance with one embodiment of the present disclosure. FIG. 12 illustrates, in a schematic top-view diagram, an intermediate semiconductor device in accordance with one embodiment of the present disclosure. FIG. 13 is a schematic cross-sectional view diagram taken along the line A-A' in FIG. 12 illustrating part of a flow for fabricating the semiconductor device 100A in accordance with one embodiment of the present disclosure. FIG. 14 is a schematic cross-sectional view diagram taken along the line B-B' in FIG. 12 illustrating part of the flow for fabricating the semiconductor device 100A in accordance with one embodiment of the present disclosure.

With reference to FIGS. 11 to 14, at step S11, in the embodiment depicted, a substrate 101 may be provided, and a first stop layer 103, an isolation layer 105 and a plurality of fins 107 may be formed above the substrate 101. The first stop layer 103 may be formed on the substrate 101. A semiconductor layer (not shown) may be formed on the first stop layer 103 and may be etched until a top surface of the first stop layer 103 is exposed to form the plurality of fins 107. Because the etching process stops at the top surface of the first stop layer 103, a height of the plurality of fins 107 may be approximately equal to a thickness of the semiconductor layer, such that the thickness of the semiconductor layer may be effectively controlled. Consequently, the height of the plurality of fins 107, and thus the channel width of the semiconductor device 100A, may be effectively controlled in accordance with the requirements of circuit design, thereby obtaining good device performance.

The semiconductor layer may be, for example, a silicon layer and may be epitaxially grown on the first stop layer 103. In some embodiments, a layer of photoresist material (not shown) may be deposited over the semiconductor layer and may be patterned and developed to remove a portion of the photoresist material. The remaining photoresist material may protect the underlying material during subsequent semiconductor processes, such as an etching process. It should be noted that other masks, such as a silicon oxide mask or a silicon nitride mask, may also be used in the etching process.

With reference to FIG. 14, an insulating material such as silicon nitride, silicon oxide, silicon oxynitride, or silicon nitride oxide may be deposited to fill trenches between the plurality of fins 107 and form the isolation layer 105. Upper portions of the isolation layer 105 may be recessed to expose upper portions of the plurality of fins 107. A recess process may include a selective etching process.

Figure 15:
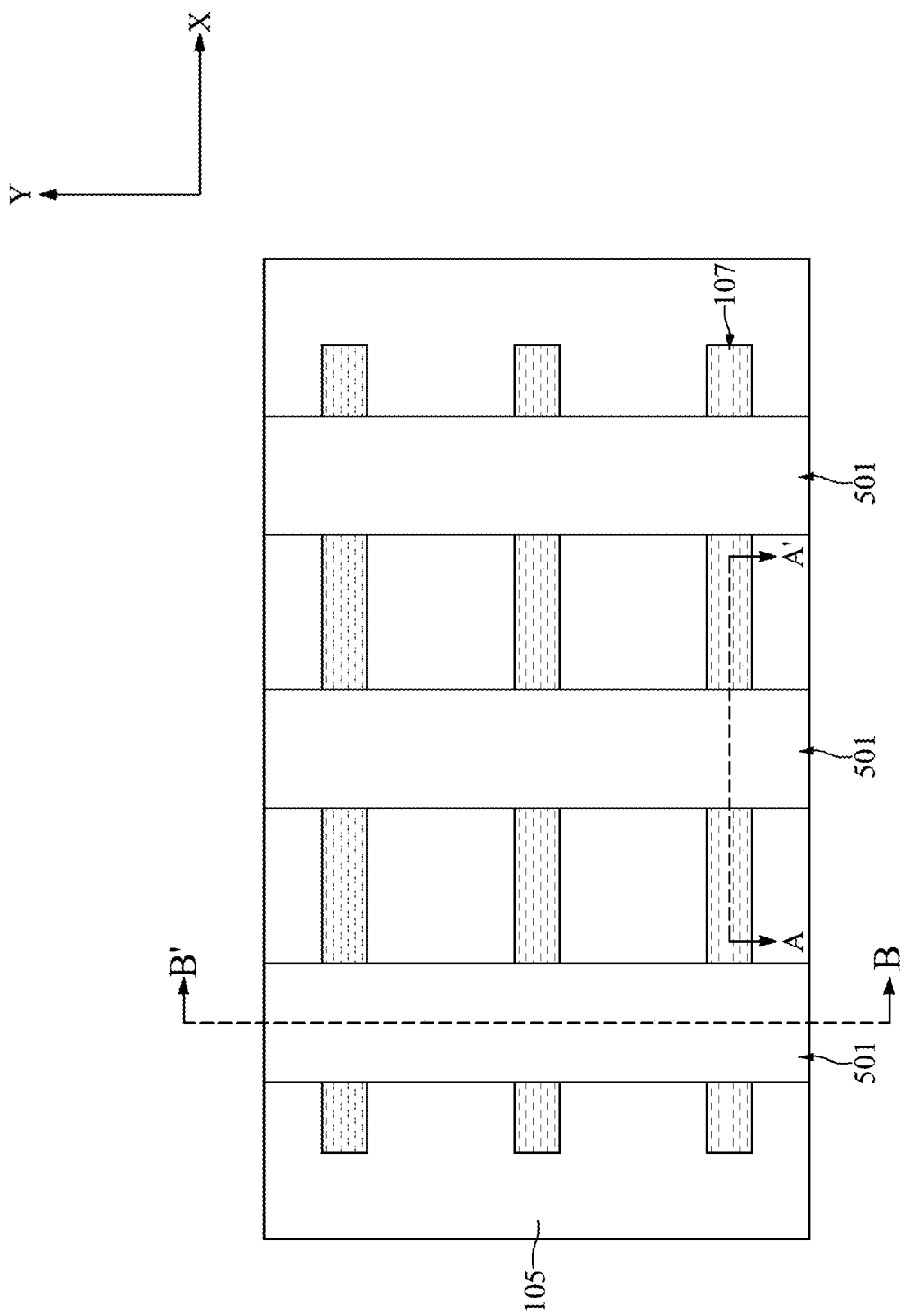
FIG. 15 illustrates, in a schematic top-view diagram, an intermediate semiconductor device in accordance with one embodiment of the present disclosure.
Figure 16:
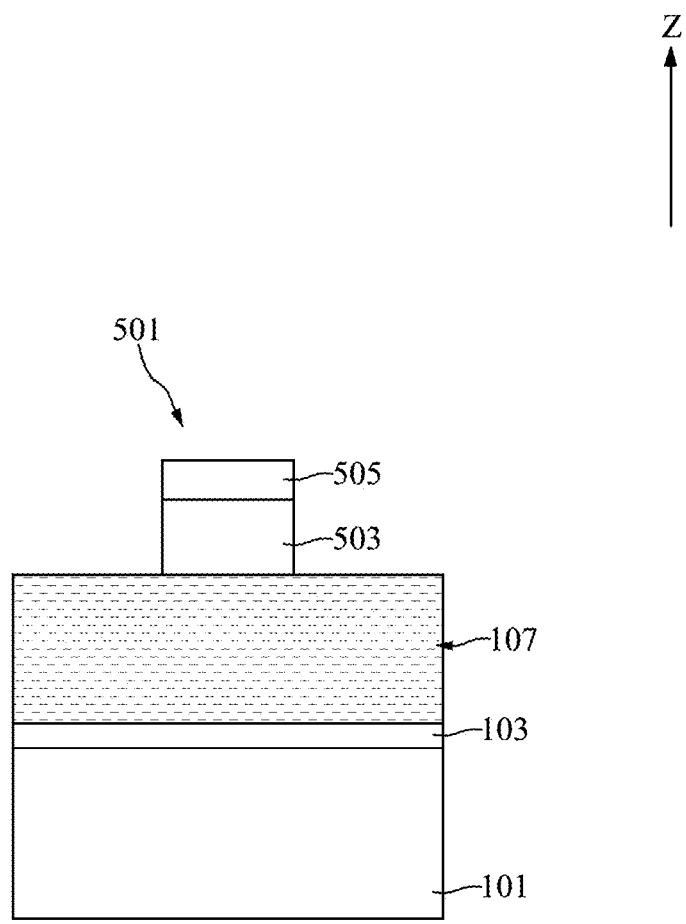
FIG. 16 is a schematic cross-sectional view diagram taken along the line A-A' in FIG. 15 illustrating part of a flow for fabricating the semiconductor device in accordance with one embodiment of the present disclosure.
Figure 17:
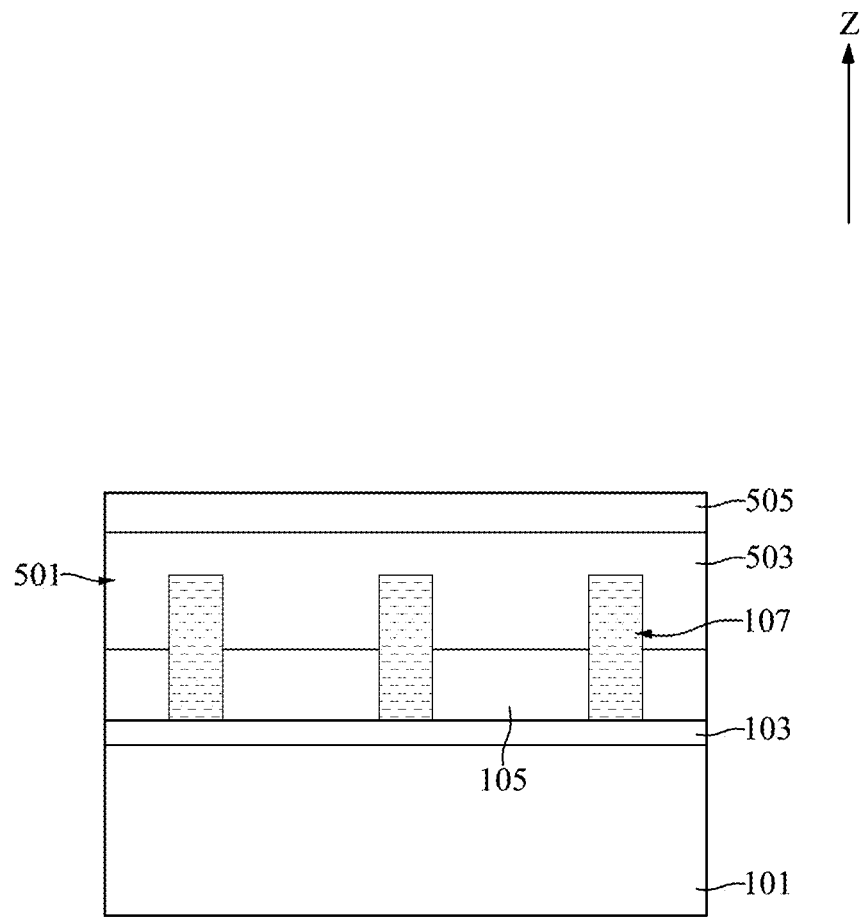
FIG. 17 is a schematic cross-sectional view diagram taken along the line B-B' in FIG. 15 illustrating part of a flow for fabricating a semiconductor device in accordance with one embodiment of the present disclosure.

FIG. 15 illustrates, in a schematic top-view diagram, an intermediate semiconductor device in accordance with one embodiment of the present disclosure. FIG. 16 is a schematic cross-sectional view diagram taken along the line A-A' in FIG. 15 illustrating part of the flow for fabricating the semiconductor device 100A in accordance with one embodiment of the present disclosure. FIG. 17 is a schematic cross-sectional view diagram taken along the line B-B' in FIG. 15 illustrating part of the flow for fabricating the semiconductor device 100A in accordance with one embodiment of the present disclosure. FIGS. 18 to 25 are schematic cross-sectional view diagrams taken along the line A-A' in FIG. 15 illustrating parts of the flow for fabricating the semiconductor device 100A in accordance with one embodiment of the present disclosure.

With reference to FIGS. 11 and 15 to 17, at step S13, in the embodiment depicted, a plurality of dummy gate structures 501 may be formed on the isolation layer 105 and the plurality of fins 107. Each of the plurality of dummy gate structures 501 may include a dummy gate bottom layer 503 and a dummy gate mask layer 505. The dummy gate bottom layer 503 may be formed on the isolation layer 105 and the plurality of fins 107. The dummy gate bottom layer 503 may be formed of, for example, polysilicon. The dummy gate mask layer 505 may be formed on the dummy gate bottom layer 503. The dummy gate mask layer 505 may be formed of, for example, silicon nitride, silicon oxynitride, silicon nitride oxide, aluminum oxide, or zirconium oxide.

Figure 18:
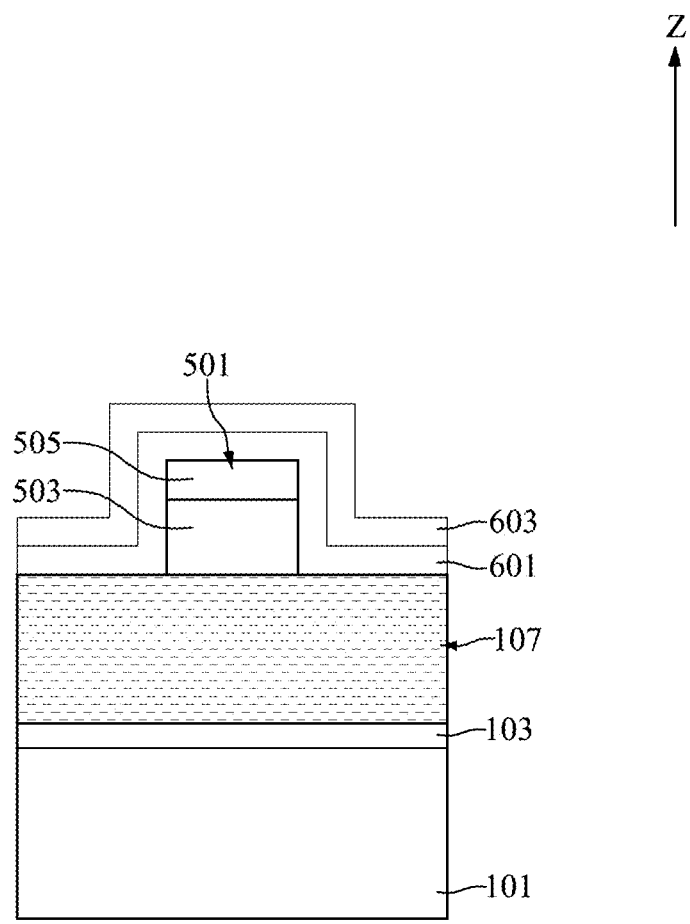
FIGS. 18 to 25 are schematic cross-sectional view diagrams taken along the line A-A' in FIG. 15 illustrating parts of a flow for fabricating a semiconductor device in accordance with one embodiment of the present disclosure.
Figure 19:
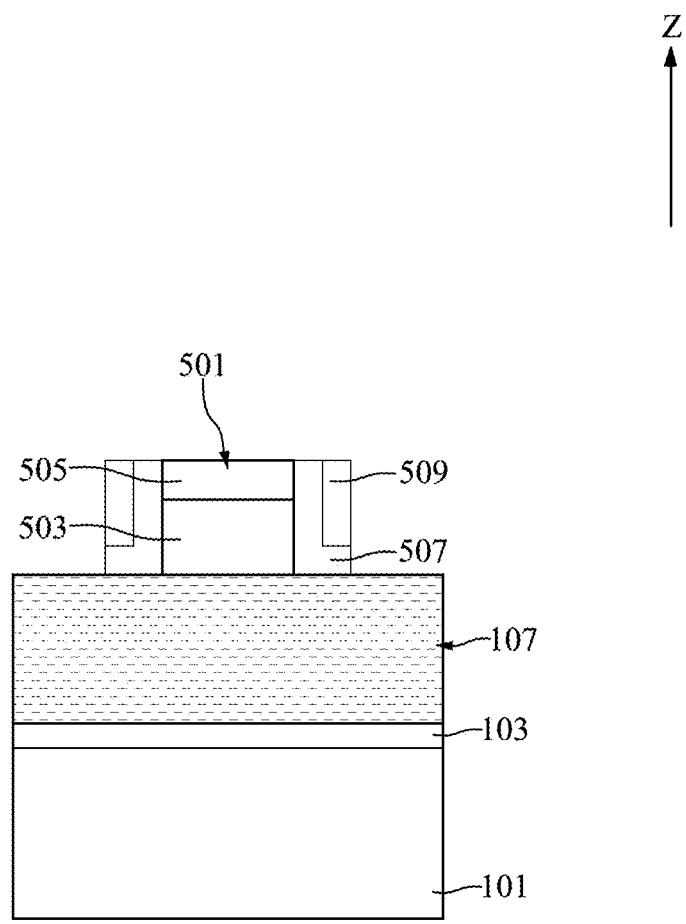

With reference to FIGS. 11, 18 and 19, at step S15, in the embodiment depicted, first dummy spacers 507 and second dummy spacers 509 may be formed adjacent to the dummy gate structure 501. With reference to FIG. 18, a layer of a first dummy spacer material 601 may be formed to cover the fin 107, sidewalls of the dummy gate bottom layer 503, sidewalls of the dummy gate mask layer 505, and a top surface of the dummy gate mask layer 505. The first dummy spacer material 601 may be, for example, silicon oxide, silicon nitride, silicon oxynitride, silicon nitride oxide, aluminum oxide, or zirconium oxide. A layer of a second dummy spacer material 603 may be formed to cover the layer of the first dummy spacer material 601. The second dummy spacer material 603 may be, for example, silicon oxide, silicon nitride, silicon oxynitride, silicon nitride oxide, aluminum oxide, or zirconium oxide. The first dummy spacer material 601 may be different from the second dummy spacer material 603.

With reference to FIG. 19, a first etching process may be performed to remove portions of the second dummy spacer material 603 and form the two second dummy spacers 509 adjacent to sides of the dummy gate structure 501. The first etching process may have an etching selectivity to the second dummy spacer material 603. The selectivity of an etching process may be generally expressed as a ratio of etching rates. For example, if one material is etched 25 times faster than other materials, the etch process may be described as having a selectivity of 25:1 or simply 25. In this regard, higher ratios or values indicate more selective etching processes. In the first etching process, an etching rate for the second dummy spacer material 603 may be greater than an etching rate of the first dummy spacer material 601, an etching rate of the dummy gate mask layer 505, and an etching rate of the fin 107. The selectivity of the first etching process may be greater than or equal to about 10, greater than or equal to about 12, greater than or equal to about 15, greater than or equal to about 20, or greater than or equal to about 25.

With reference to FIG. 19, a second etching process may be performed to remove portions of the first dummy spacer material 601 and form the two first dummy spacers 507 adjacent to sides of the dummy gate structure 501. The second etching process may have an etching selectivity to the first dummy spacer material 601. In the second etching process, an etching rate for the first dummy spacer material 601 may be greater than an etching rate of the second dummy spacer material 603, an etching rate of the dummy gate mask layer 505, and an etching rate of the fin 107. The selectivity of the second etching process may be greater than or equal to about 10, greater than or equal to about 12, greater than or equal to about 15, greater than or equal to about 20, or greater than or equal to about 25.

Figure 20:
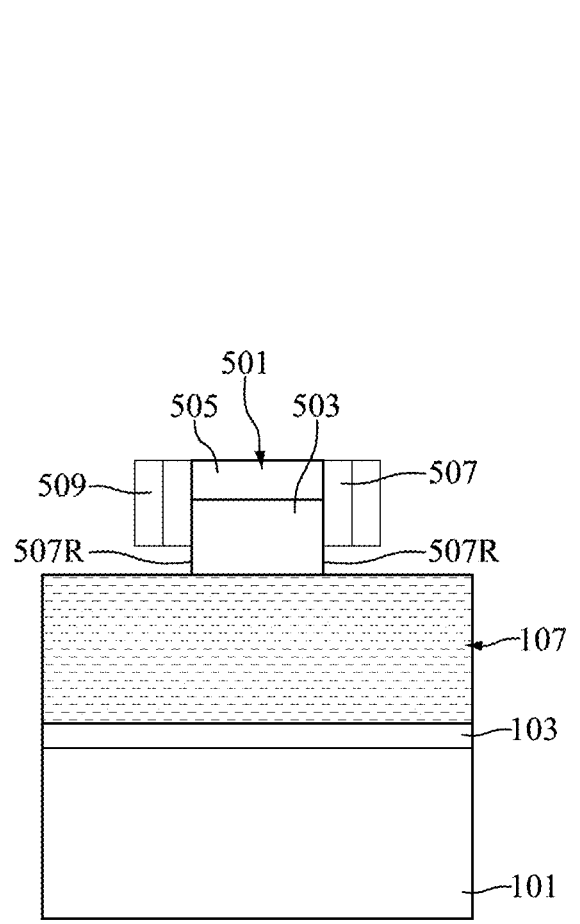

With reference to FIGS. 11 and 20 to 22, at step S17, in the embodiment depicted, two bottom etch stop layers 211 may be respectively correspondingly formed below the two first dummy spacers 507. With reference to FIG. 20, the two second dummy spacers 509 may act as an etching mask. A lateral recess process may be performed to remove portions of the two first dummy spacers 507 and concurrently form recessed portions of first dummy spacers 507R. The lateral recess process may be, for example, an isotropic wet etching process.

Figure 21:
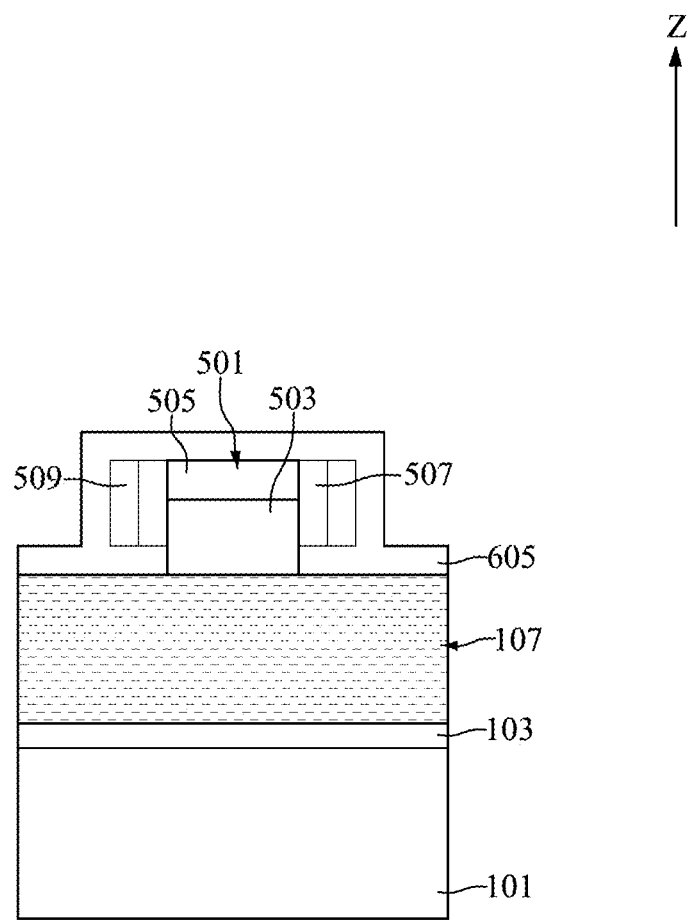
Figure 22:
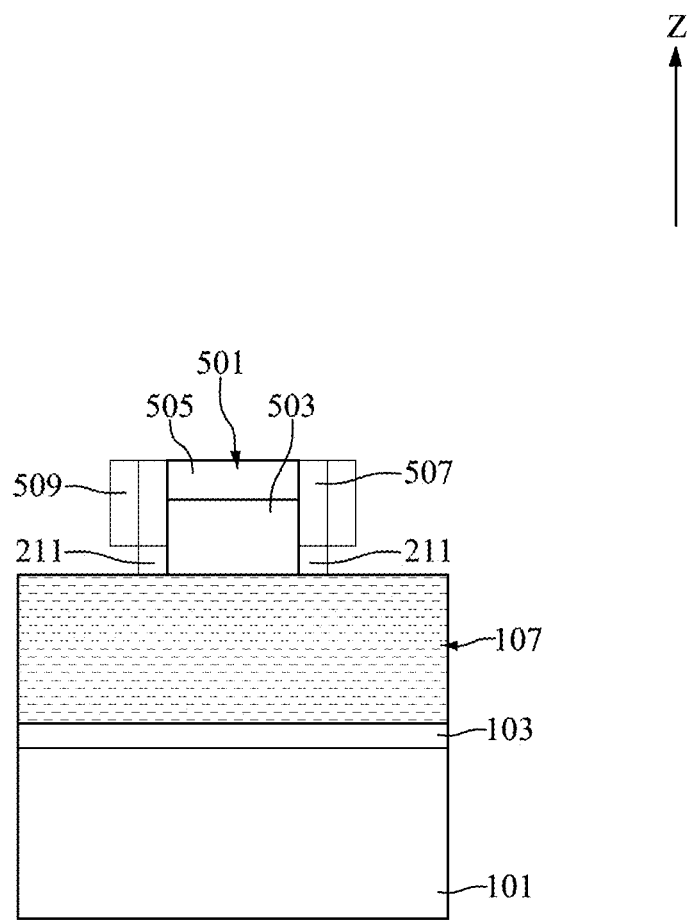

With reference to FIG. 21, a layer of a bottom etch stop layer material 605 may be deposited in the recessed portions of the first dummy spacers 507R and over the two first dummy spacers 507, the two second dummy spacers 509, and the dummy gate mask layer 505. The bottom etch stop layer material 605 may be, for example, carbon-doped oxide, carbon incorporated silicon oxide, ornithine decarboxylase, or nitrogen-doped silicon carbide. The deposition of the layer of the bottom etch stop layer material 605 may be performed using, for example, chemical vapor deposition, plasma-enhanced chemical vapor deposition, atomic layer deposition, physical vapor deposition, or spin-on deposition. With reference to FIG. 22, an etch-back process may be performed to remove portions of the layer of the bottom etch stop layer material 605 and concurrently form the two bottom etch stop layers 211. The etch-back process may be an anisotropic etching process such as reactive ion etching or wet etching. The etch-back process may be generally difficult to control with precision. However, the two second dummy spacers 509 may protect the two first dummy spacers 507 during the etch-back process, such that the length of these features can be precisely controlled and consistently produced.

Figure 23:
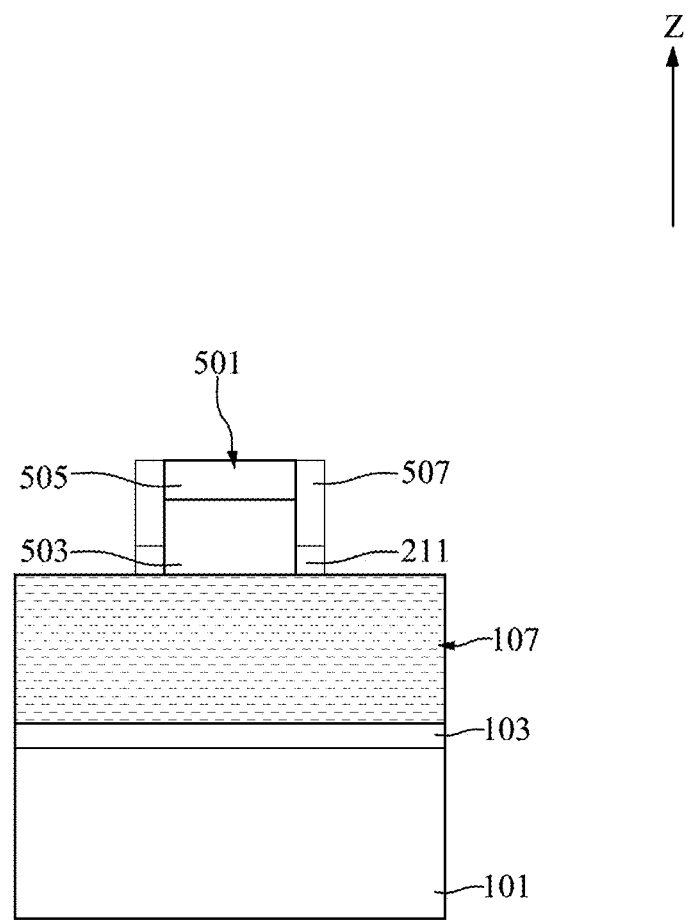
Figure 24:
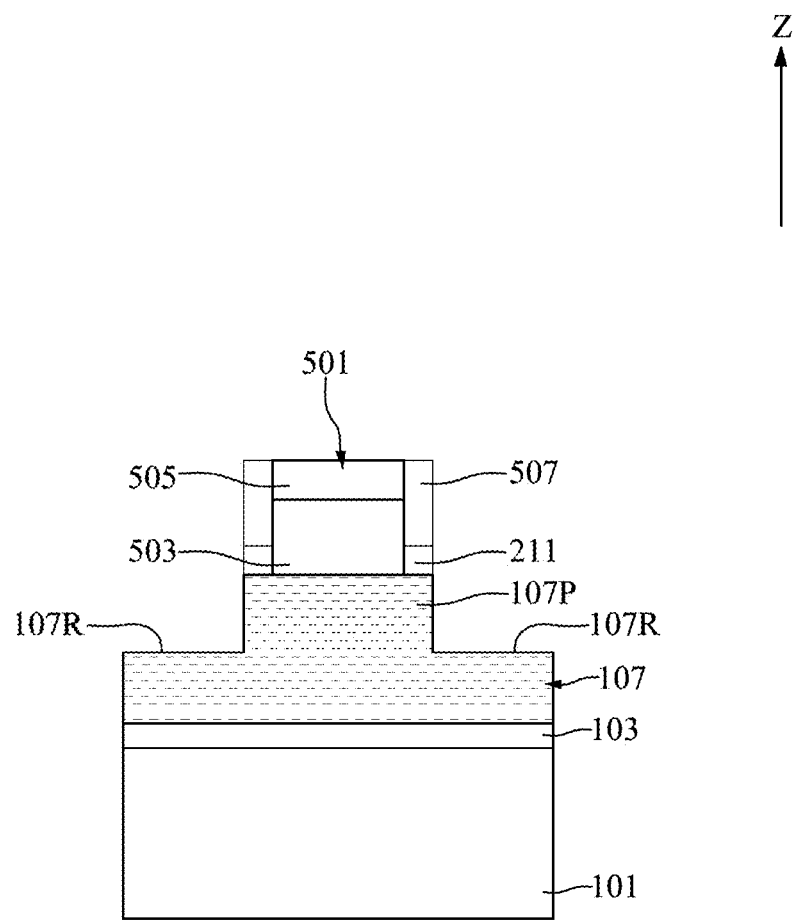

With reference to FIGS. 11, 23 and 24, at step S19, in the embodiment depicted, the two second dummy spacers 509 may be removed and the plurality of fins 107 may be recessed. With reference to FIG. 23, the two second dummy spacers 509 may be removed by a first etching process. In the first etching process, an etching rate for the two second dummy spacers 509 may be greater than an etching rate of the two first dummy spacers 507, an etching rate of the dummy gate mask layer 505, an etching rate of the two bottom etch stop layers 211, and an etching rate of the fin 107. With reference to FIG. 24, a second etching process may be performed to recess portions of the fin 107 adjacent to the sides of the gate structure 201. After the second etching process, the fin 107 may include a protruding portion 107P and recessed portions 107R adjacent to the protruding portion 107P. In the second etching process, an etching rate for the fin 107 may be greater than an etching rate of the two first dummy spacers 507, an etching rate of the dummy gate mask layer 505, and an etching rate of the two bottom etch stop layers 211.

Figure 25:
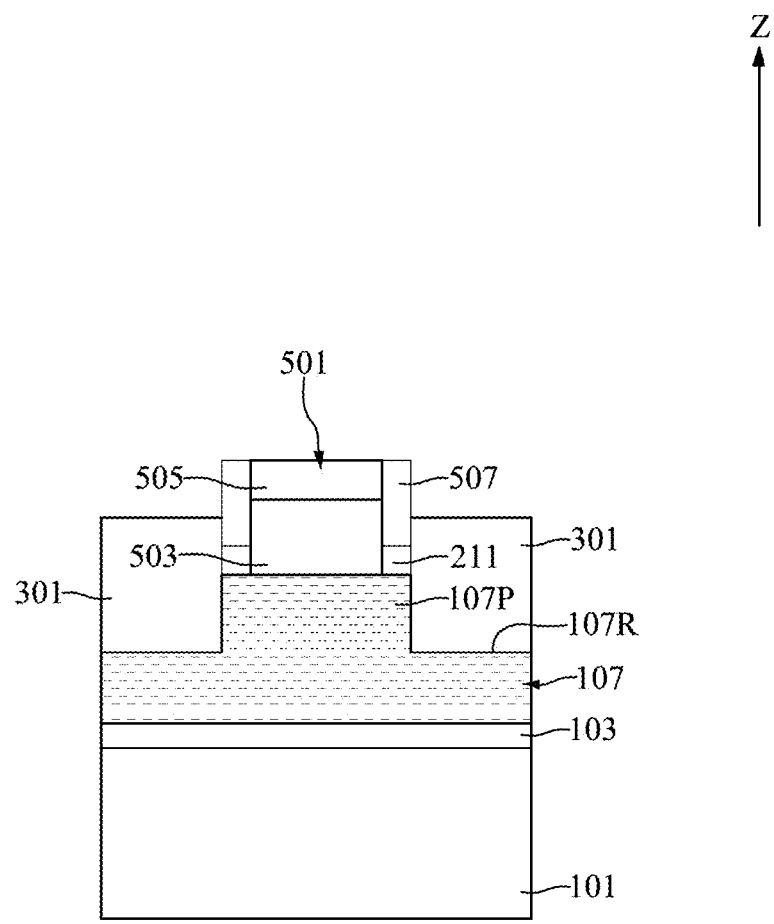

With reference to FIGS. 11 and 25, at step S21, in the embodiment depicted, a plurality of source/drain regions 301 may be respectively correspondingly formed on the recessed portions 107R and adjacent to the plurality of dummy gate structures 501. The plurality of source/drain regions 301 may be formed by an epitaxial growth process. The plurality of source/drain regions 301 may be in-situ doped during the epitaxial growth process or may be doped with an implantation process after the epitaxial growth process. The plurality of source/drain regions 301 may include silicon and dopants such as phosphorus, arsenic, antimony, boron, or indium. The plurality of source/drain regions 301 may have a dopant concentration between about 1E19 atoms/cm$^3$ and about 5E21 atoms/cm$^3$. An annealing process may be performed to activate the plurality of source/drain regions 301. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

Figure 26:
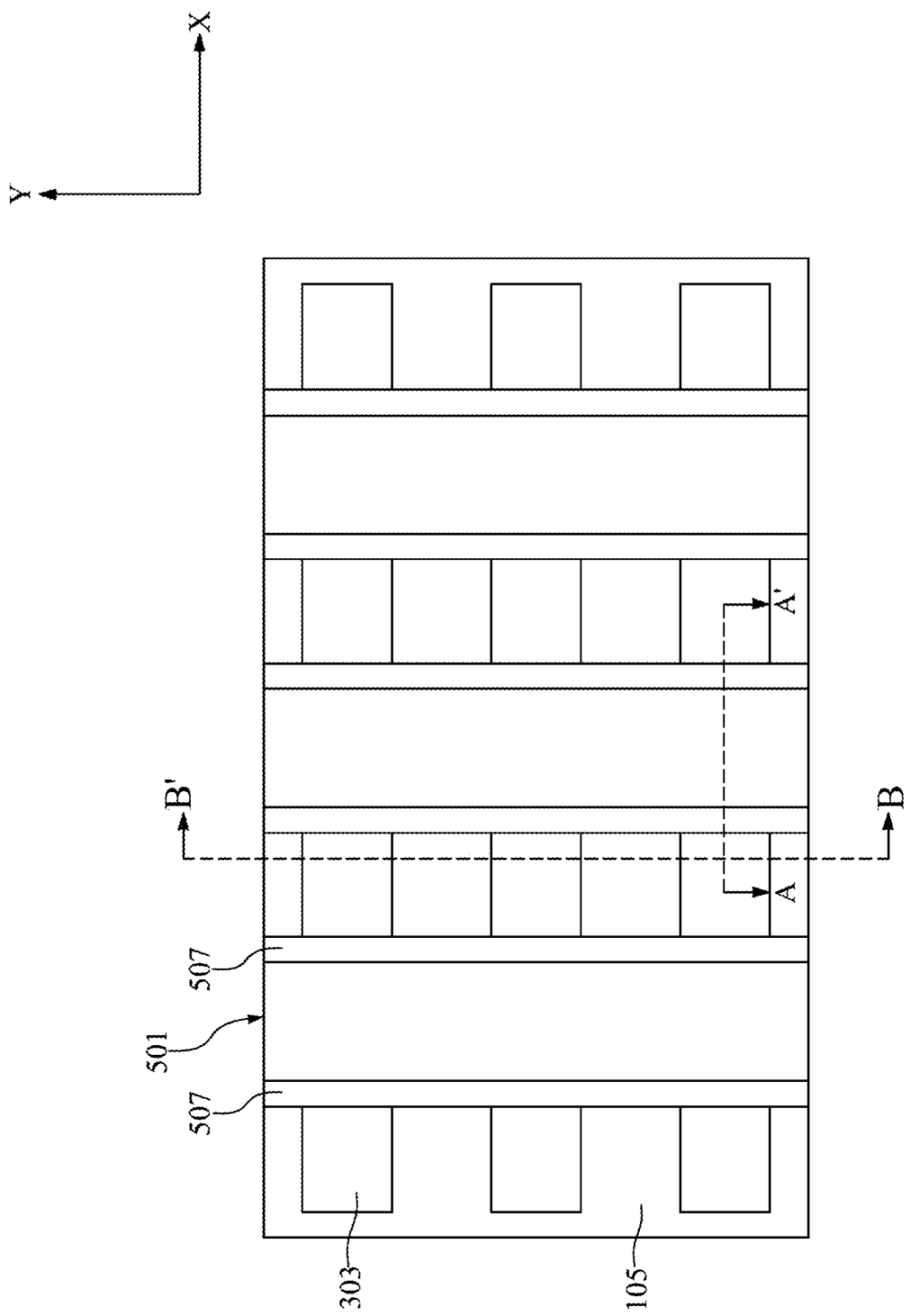
FIG. 26 illustrates, in a schematic top-view diagram, an intermediate semiconductor device in accordance with one embodiment of the present disclosure.
Figure 27:
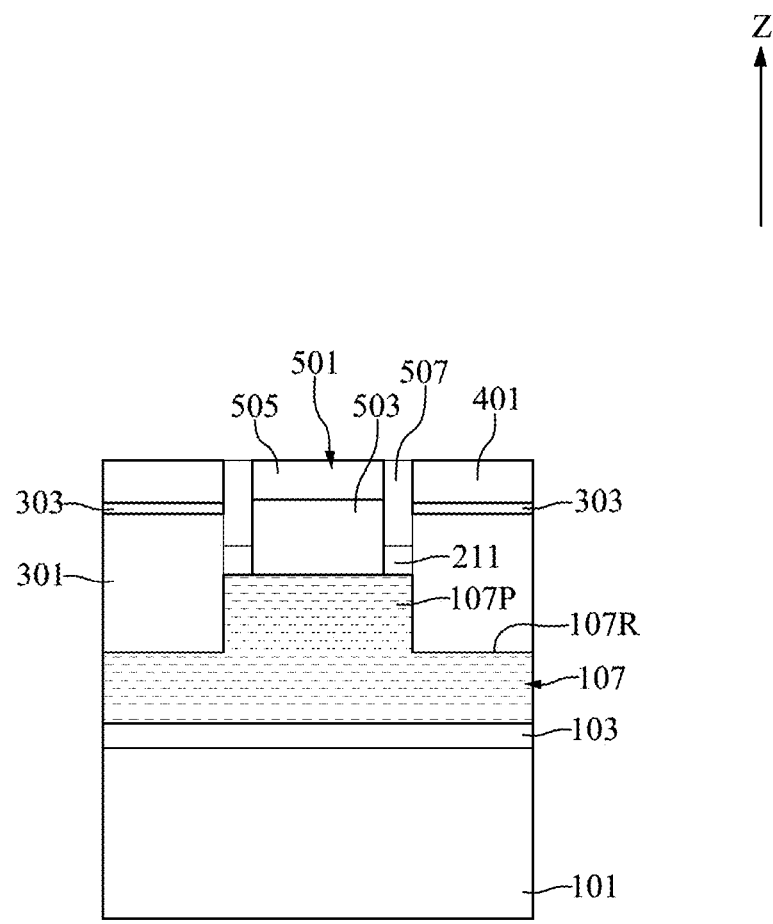
FIG. 27 is a schematic cross-sectional view diagram taken along the line A-A' in FIG. 26 illustrating part of a flow for fabricating a semiconductor device in accordance with one embodiment of the present disclosure.
Figure 28:
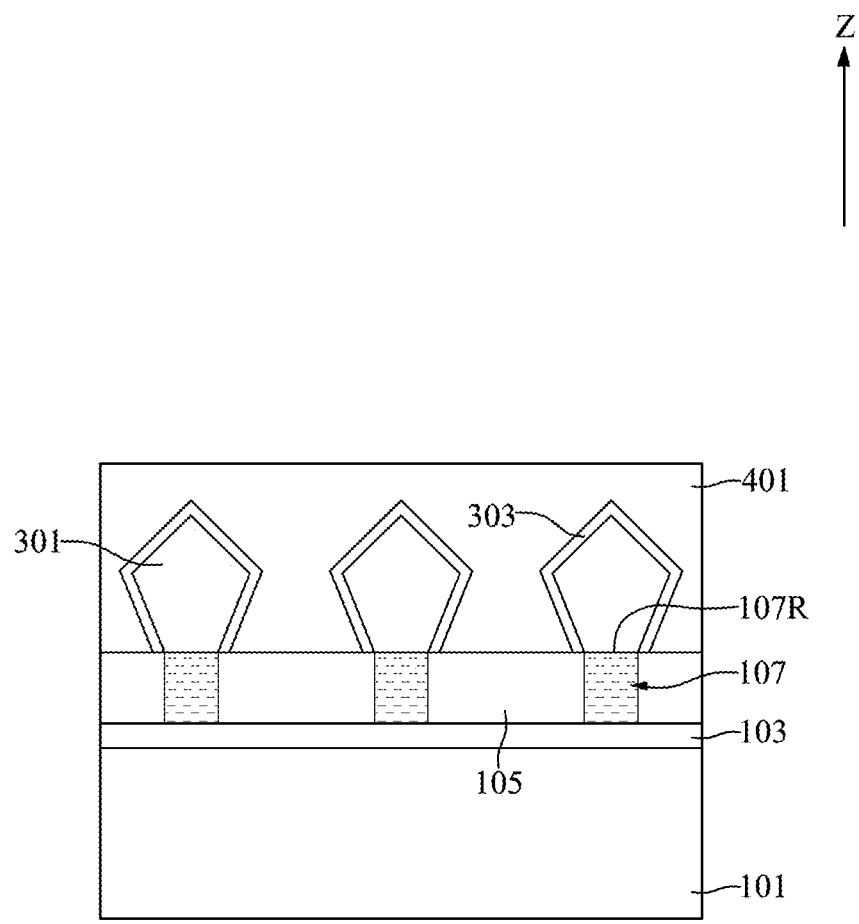
FIG. 28 is a schematic cross-sectional view diagram taken along the line B-B' in FIG. 26 illustrating part of a flow for fabricating a semiconductor device in accordance with one embodiment of the present disclosure.

FIG. 26 illustrates, in a schematic top-view diagram, an intermediate semiconductor device in accordance with one embodiment of the present disclosure. FIG. 27 is a schematic cross-sectional view diagram taken along the line A-A' in FIG. 26 illustrating part of the flow for fabricating the semiconductor device 100A in accordance with one embodiment of the present disclosure. FIG. 28 is a schematic cross-sectional view diagram taken along the line B-B' in FIG. 26 illustrating part of the flow for fabricating the semiconductor device 100A in accordance with one embodiment of the present disclosure.

With reference to FIGS. 11, 27 and 28, at step S23, in the embodiment depicted, a plurality of covering layers 303 may be respectively correspondingly formed on the plurality of source/drain regions 301 and a first insulating layer 401 may be formed on the plurality of covering layers 303 and the isolation layer 105. For the formation of the plurality of covering layers 303, a metal layer may be deposited over the plurality of source/drain regions 301 and a thermal treatment may be performed. The metal layer may include, for example, titanium, nickel, platinum, tantalum, or cobalt. During the thermal treatment, metal atoms of the metal layer may react chemically with silicon atoms of the plurality of source/drain regions 301 to form the plurality of covering layers 303. The plurality of covering layers 303 may include titanium silicide, nickel silicide, nickel platinum silicide, tantalum silicide, or cobalt silicide. The thermal treatment may be a dynamic surface annealing process and may cause a shallow-depth region of the source/drain regions 301 to reach a silicidation temperature. After the thermal treatment, a cleaning process may be performed to remove the unreacted metal layer. The cleaning process may use etchant such as hydrogen peroxide and an SC-1 solution.

With reference to FIGS. 27 and 28, an insulating material may be deposited over the plurality of covering layers 303, the isolation layer 105, the plurality of dummy gate structures 501, and the first dummy spacers 507. The deposition process may be a chemical vapor deposition, a plasma-enhanced chemical vapor deposition, or a sputtering deposition. The insulating material may have a dielectric constant between about 2.4 and 3.5. A planarization process, such as chemical mechanical polishing, may be performed until a top surface of the dummy gate mask layer 505 is exposed, in order to remove excess material, provide a substantially flat surface for subsequent processing steps, and conformally form the first insulating layer 401.

Figure 29:
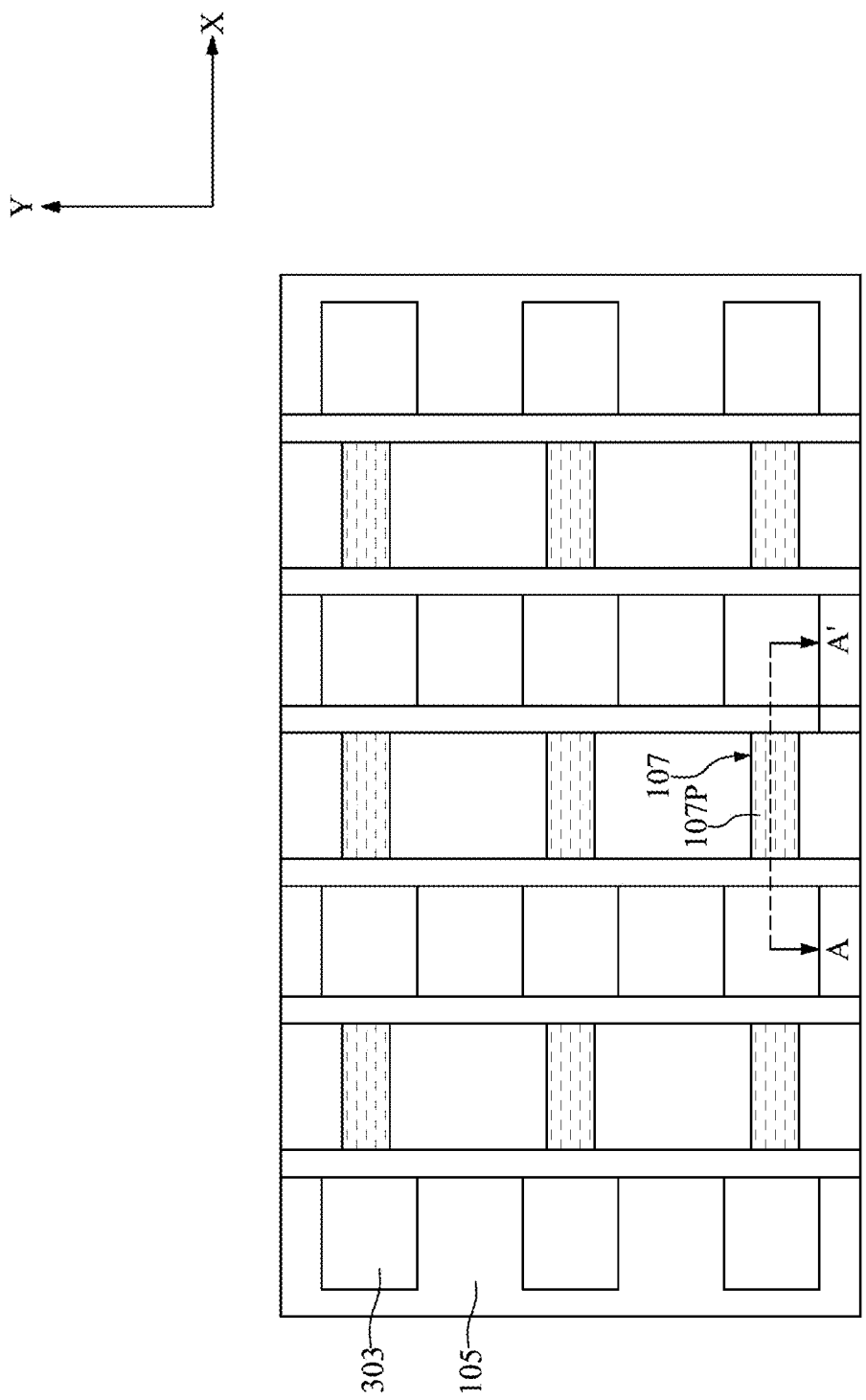
FIG. 29 illustrates, in a schematic top-view diagram, an intermediate semiconductor device in accordance with one embodiment of the present disclosure.

FIG. 29 illustrates, in a schematic top-view diagram, an intermediate semiconductor device in accordance with one embodiment of the present disclosure. FIGS. 30 to 35 are schematic cross-sectional view diagrams taken along the line A-A' in FIG. 29 illustrating parts of the flow for fabricating the semiconductor device 100A in accordance with one embodiment of the present disclosure.

Figure 30:
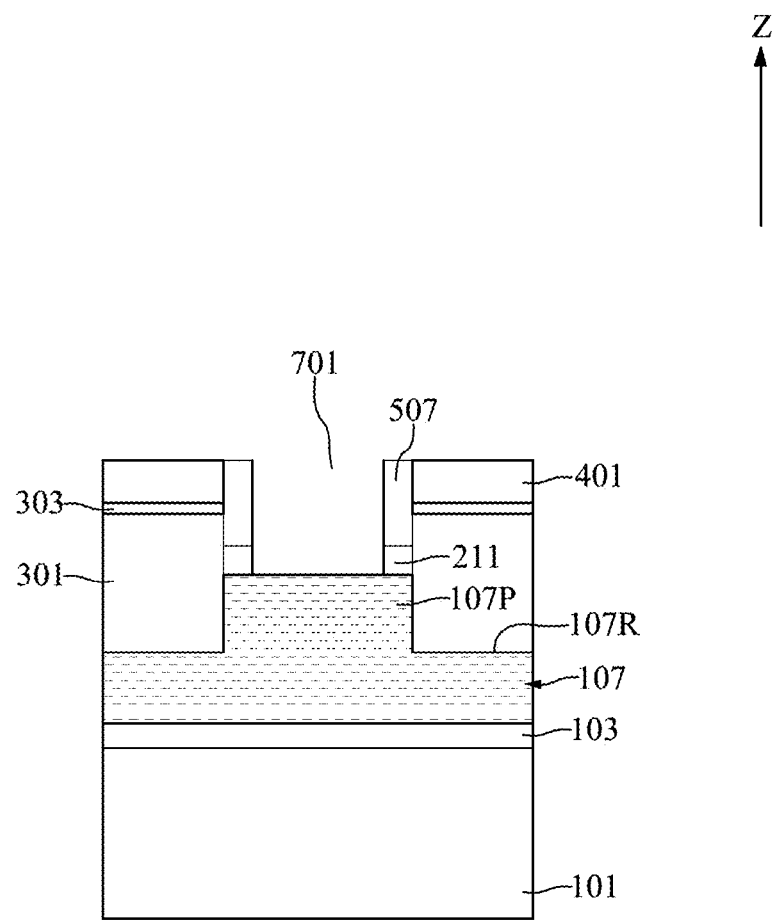
FIGS. 30 to 35 are schematic cross-sectional view diagrams taken along the line A-A' in FIG. 29 illustrating parts of a flow for fabricating a semiconductor device in accordance with one embodiment of the present disclosure.
Figure 31:
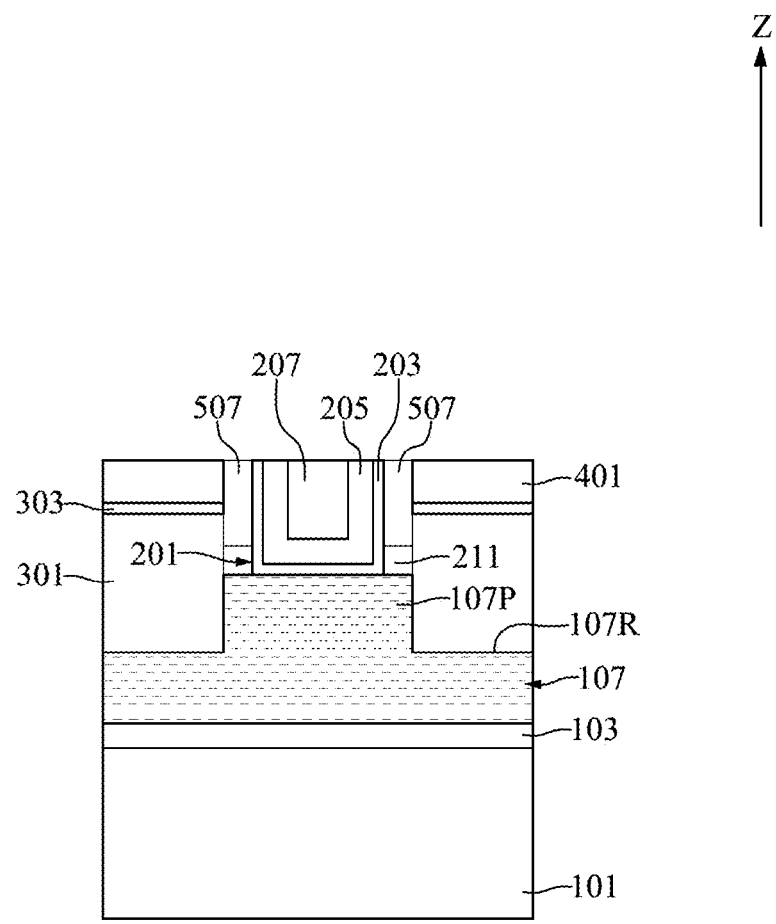

With reference to FIGS. 11 and 29 to 31, at step S25, in the embodiment depicted, the plurality of dummy gate structures 501 may be removed and a plurality of gate structures 201 may be formed in situ. With reference to FIGS. 29 and 30, the dummy gate mask layer 505 and the dummy gate bottom layer 503 may be removed by a multi-step etching process. After the removal of the dummy gate structure 501, a first trench 701 may be formed in situ; in other words, the first trench 701 may be formed in the place previously occupied by the dummy gate structure 501. With reference to FIG. 31, the gate structure 201 may be formed in the first trench 701. The gate structure 201 may include a gate insulating layer 203, a gate conductive layer 205, and a gate filler layer 207. The gate insulating layer 203 may be formed in the first trench 701 by a deposition process such as chemical vapor deposition, physical vapor deposition, atomic layer deposition, thermal treatment, ozone oxidation, or a combination thereof.

With reference to FIG. 31, the gate conductive layer 205 may be formed on the gate insulating layer 203 by another deposition process suitable for depositing conductive materials, such as chemical vapor deposition or sputtering deposition. The gate filler layer 207 may be formed on the gate conductive layer 205 by another deposition process similar to that of the deposition of the gate conductive layer 205. A planarization process, such as chemical mechanical polishing, may be performed to provide a substantially flat surface for subsequent processing steps.

Figure 32:
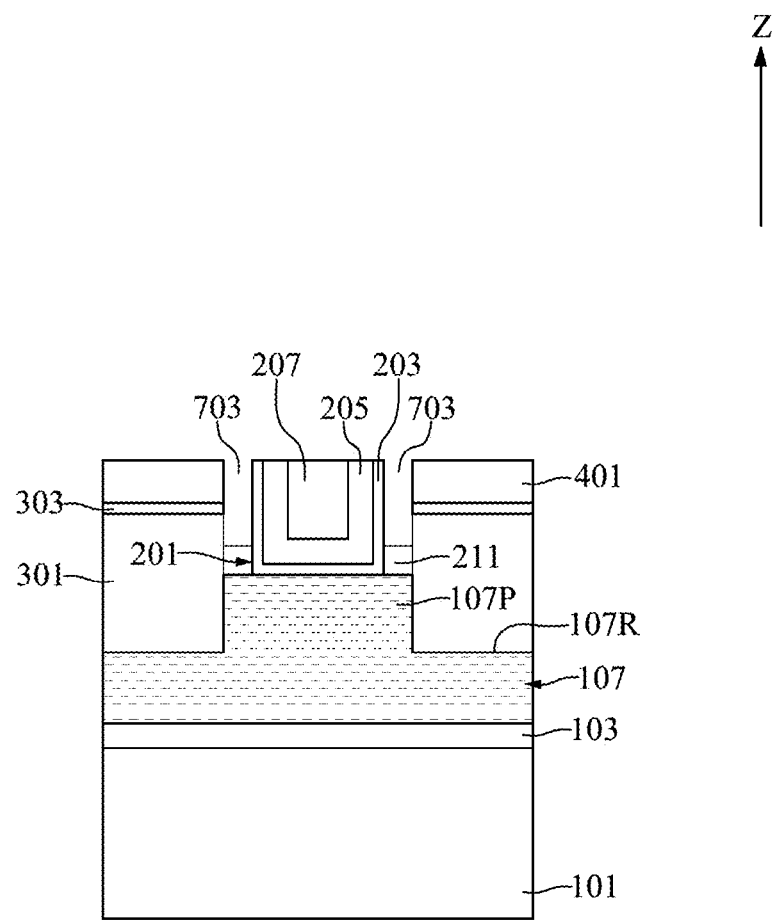

With reference to FIGS. 11 and 32, at step S27, in the embodiment depicted, the two first dummy spacers 507 may be removed and second trenches 703 may be formed in situ. The two first dummy spacers 507 may be removed by an etching process. A gate mask layer (not shown) may be formed on the gate structure 201 before the etching process to protect the gate structure 201. In the etching process, an etching rate of the two first dummy spacers 507 may be greater than an etching rate of the first insulating layer 401, an etching rate of the gate mask layer, and an etching rate of the two bottom etch stop layers 211.

Figure 33:
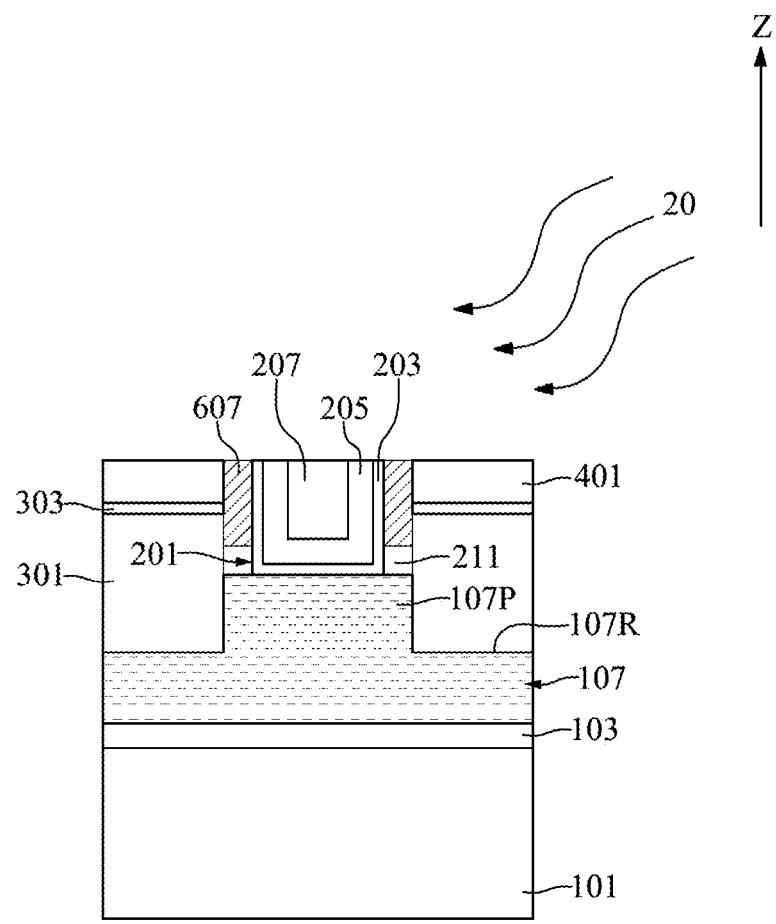
Figure 34:
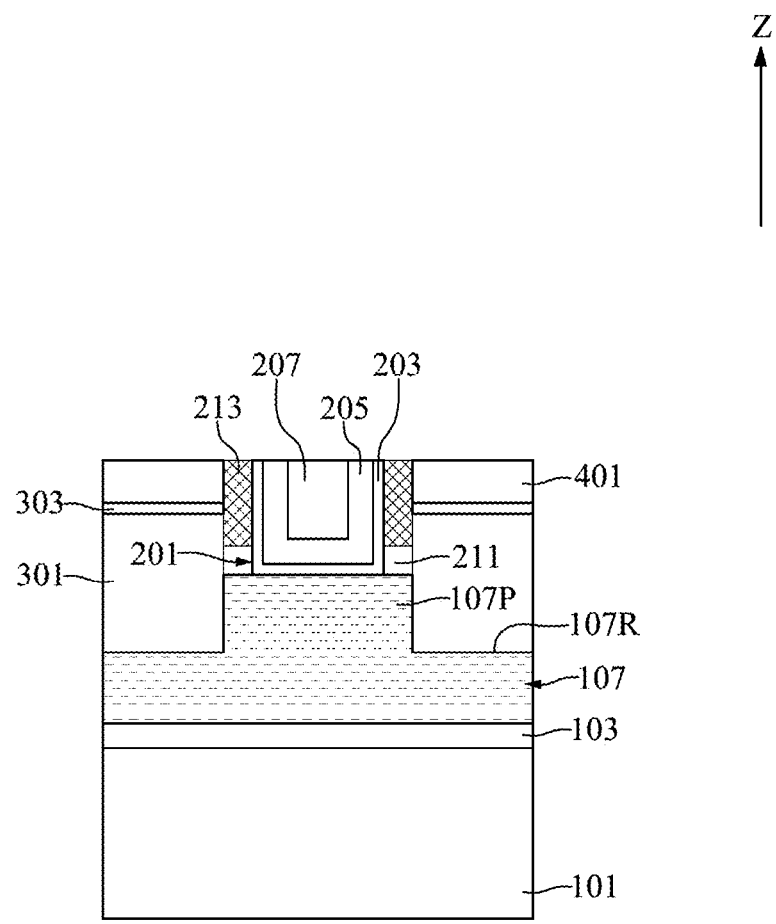

With reference to FIGS. 11, 33 and 34, at step S29, in the embodiment depicted, an energy-removable material 607 may be deposited in the second trenches 703 and an energy treatment 20 may be performed to form two porous spacers 213 in the second trenches 703. With reference to FIG. 33, an energy-removable material 607 may be deposited in the second trenches 703. The energy-removable material 607 may include a material such as a thermal decomposable material, a photonic decomposable material, an e-beam decomposable material, or a combination thereof. For example, the energy-removable material 607 may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material. The energy treatment 20 may be performed by applying the energy source to the intermediate semiconductor device in FIG. 33. The energy source may include heat, light, or a combination thereof. When heat is used as the energy source, a temperature of the energy treatment may be between about 800° C. and about 900° C. When light is used as the energy source, an ultraviolet light may be applied. The energy treatment 20 may remove the decomposable porogen material from the energy-removable material to generate empty spaces (pores), with the base material remaining in place.

Alternatively, in another embodiment, the base material may be silicon oxide. The decomposable porogen material may include compounds including unsaturated bonds such as double bonds or triple bonds. During the energy treatment 20, the unsaturated bonds of the decomposable porogen material may cross-link with silicon oxide of the base material. As a result, the decomposable porogen material may shrink and generate empty spaces, with the base material remaining in place. The empty spaces may be filled with air so that a dielectric constant of the empty spaces may be significantly low.

In some embodiments, the energy-removable material may include a relatively high concentration of the decomposable porogen material and a relatively low concentration of the base material, but is not limited thereto. For example, the energy-removable material 607 may include about 75% or greater of the decomposable porogen material, and about 25% or less of the base material. In another example, the energy-removable material 607 may include about 95% or greater of the decomposable porogen material, and about 5% or less of the base material. In another example, the energy-removable material 607 may include about 100% of the decomposable porogen material, and no base material is used. In another example, the energy-removable material 607 may include about 45% or greater of the decomposable porogen material, and about 55% or less of the base material.

With reference to FIG. 34, after the energy treatment 20, the energy-removable material 607 in the second trenches 703 may turn into the two porous spacers 213. The base material may turn into a skeleton of the two porous spacers 213 and the empty spaces may be distributed among the skeleton of the two porous spacers 213. According to the composition of the energy-removable material 607, the two porous spacers 213 may have a porosity of 45%, 75%, 95%, or 100%. A planarization process, such as chemical mechanical polishing, may be performed after the energy treatment 20 to provide a substantially flat surface for subsequent processing steps.

Figure 35:
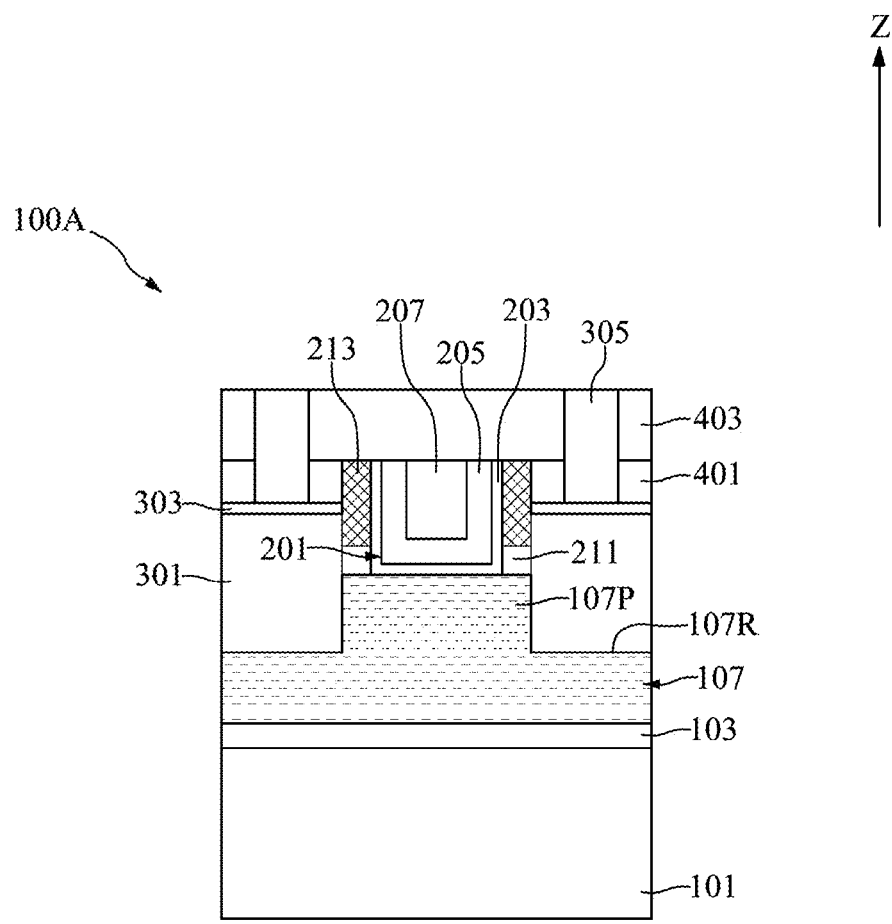

With reference to FIGS. 11 and 35, at step S31, in the embodiment depicted, a second insulating layer 403 may be formed on the first insulating layer 401 and a plurality of contacts 305 may be respectively correspondingly formed on the plurality of covering layers 303. The second insulating layer 403 may be formed by a procedure similar to that of the formation of the first insulating layer 401. A photolithography process may be performed to define positions of the plurality of contacts 305. After the photolithography process, an etching process, such as an anisotropic dry etch process, may be performed to form a plurality of contact openings penetrating the second insulating layer 403 and the first insulating layer 401. A conductive material, such as tungsten, copper, cobalt, ruthenium, or molybdenum, may be deposited into the plurality of contact openings by a deposition process. After the deposition process, a planarization process, such as chemical mechanical polishing, may be performed to remove excess material, provide a substantially flat surface for subsequent processing steps, and conformally form the plurality of contacts 305.

One aspect of the present disclosure provides a semiconductor device including a substrate; two conductive features positioned apart from each other over the substrate; a graded porous dielectric structure positioned between the two conductive features; and a dielectric layer positioned between one of the two conductive features and the graded porous dielectric structure; wherein the graded porous dielectric structure comprises a first portion having a first porosity and a second portion having a second porosity, and the second porosity is higher than the first porosity.

Another aspect of the present disclosure provides a semiconductor device semiconductor device, comprising: a substrate; a gate structure positioned above the substrate; two source/drain regions positioned adjacent to two sides of the gate structure; a graded porous dielectric structure positioned between the gate structure and the source/drain regions, wherein the graded porous dielectric structure has a graded porosity along a direction from the gate structure to the source/drain regions; and an insulating layer disposed over the two porous spacers and the porous capping layer.

Due to the design of the semiconductor device of the present disclosure, a coupling capacitance between the gate structure and the source/drain regions may be reduced; so that an RC delay of the semiconductor device may be reduced. In addition, with the presence of the covering layer, an operating current consumption of the semiconductor device may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a gate structure positioned above the substrate;
two porous spacers disposed adjacent to two sides of the gate structure;
a porous capping layer disposed on a top surface of the gate structure and between the two porous spacers;
two source/drain regions positioned adjacent to the two sides of the gate structure with the two porous spacers interposed therebetween;
a graded porous dielectric structure positioned between the gate structure and the source/drain regions, wherein the graded porous dielectric structure has a graded porosity along a direction from the gate structure to the source/drain regions;
an insulating layer disposed over the two porous spacers and the porous capping layer; and
two bottom etch stop layers positioned under the two porous spacers.

2. The semiconductor device of claim 1, wherein the graded porous dielectric structure comprises an energy-removable material consisting of a base material and a decomposable porogen material, and the base material comprises silicon oxide, and the decomposable porogen material comprises compounds comprising unsaturated bonds.

3. The semiconductor device of claim 1, further comprising a fin positioned between the gate structure and the substrate.

4. The semiconductor device of claim 3, wherein the fin comprises a protruding portion and two recessed portions positioned adjacent to two sides of the protruding portion, wherein a top surface of the protruding portion is at a vertical level higher than a vertical level of top surfaces of the recessed portions, the gate structure is positioned on the protruding portion, and the two source/drain regions are positioned on the recessed portions.

5. The semiconductor device of claim 4, further comprising a first stop layer positioned between the fin and the substrate.

* * * * *